United States Patent
Kawabe et al.

(10) Patent No.: US 7,423,948 B2
(45) Date of Patent: Sep. 9, 2008

(54) PHASE ERROR DETECTING CIRCUIT AND SYNCHRONIZATION CLOCK EXTRACTION CIRCUIT

(75) Inventors: Akira Kawabe, Takatsuki (JP); Kouji Okamoto, Ikeda (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 74 days.

(21) Appl. No.: 10/533,434

(22) PCT Filed: Jun. 11, 2004

(86) PCT No.: PCT/JP2004/008594

§ 371 (c)(1),
(2), (4) Date: May 2, 2005

(87) PCT Pub. No.: WO2005/027122

PCT Pub. Date: Mar. 24, 2005

(65) Prior Publication Data

US 2006/0044990 A1    Mar. 2, 2006

(30) Foreign Application Priority Data

Sep. 9, 2003    (JP)    .............................. 2003-316774
Dec. 5, 2003    (JP)    .............................. 2003-407206

(51) Int. Cl.
*G11B 7/00*    (2006.01)
(52) U.S. Cl. ................................... 369/53.34
(58) Field of Classification Search ........................ None
See application file for complete search history.

(56) References Cited

U.S. PATENT DOCUMENTS

| | | | | |
|---|---|---|---|---|
| 3,878,473 A | * | 4/1975 | Furtney, Jr. .................. | 331/1 A |
| 5,204,848 A | * | 4/1993 | Cardero et al. ........... | 369/47.28 |
| 5,629,914 A | * | 5/1997 | Clark et al. .............. | 369/59.17 |
| 5,848,047 A | * | 12/1998 | Fujimoto ................. | 369/47.18 |
| 6,151,282 A | | 11/2000 | Hamada et al. | |
| 2002/0181360 A1 | * | 12/2002 | Hamada et al. .......... | 369/47.28 |

FOREIGN PATENT DOCUMENTS

| | | |
|---|---|---|
| JP | 2000-132921 | 5/2000 |
| JP | 2000-200467 | 7/2000 |
| JP | 2000-243041 | 9/2000 |

* cited by examiner

*Primary Examiner*—Joseph Feild
*Assistant Examiner*—Christopher R Lamb
(74) *Attorney, Agent, or Firm*—McDermott Will & Emery LLP

(57) ABSTRACT

In a phase error detecting circuit used in a synchronous clock extracting circuit for extracting a clock which is synchronized with reproduced data, a cross reference value generator 72 inputs, as a rising cross reference value S5, rising phase error data S3 calculated in a phase error calculator 71 to a rising cross detector 70a and inputs, as a falling cross reference value S6, falling phase error data S4 similarly calculated to a falling cross detector 70b. Each of the cross detectors 70a and 70b calculates a difference value between the value of the reproduced data at a sampling point and the inputted cross reference value (cross offset value) S5 or S6 and outputs a rising or falling cross detection signal when one of two difference values at consecutive sampling points is negative and the other thereof is positive. Accordingly, a capture range is enlarged.

36 Claims, 27 Drawing Sheets

PHASE ERROR DETECTING CIRCUIT AND SYNCHRONIZATION CLOCK EXTRACTION CIRCUIT

TECHNICAL FIELD

The present invention relates to a phase error detecting circuit used, in a reproduced signal processing circuit for extracting data recorded in a recording medium such as an optical disk or a magnetic disk therefrom and extracting a synchronous clock which is synchronized with the data extracted, to extract the synchronous clock.

BACKGROUND ART

An example of a reproduced signal processing circuit in a conventional optical disk apparatus is shown in FIG. 23.

In FIG. 23, 1 is a recording medium such as an optical disk, 2 is an optical pick-up, 3 is an analog front end, and 12 is a digital signal processing circuit. In the digital signal processing circuit 12 mentioned above, 4 is an A/D converter, 5 is a digital filter, 6 is a decoder, and 13 is a synchronous clock extracting circuit. In the synchronous clock extracting circuit 13 mentioned above, 7 is a phase comparator, 8 and 11 are loop filters, 9 is a VCO (voltage control oscillator), and 10 is a frequency comparator. A description will be given herein below to the detail of the foregoing structure and to the outline of the operation thereof.

When data written in the recording medium 1 such as an optical disk is to be reproduced therefrom, a laser beam is applied to the recording medium 1 first, the reflected beam is picked up therefrom by using the optical pick-up 2, and the intensity of the reflected light is converted to an electric signal so that an analog reproduced signal is generated. The analog reproduced signal obtained by using the optical pick-up 2 is subjected to the gain adjustment of the signal amplitude and DC offset adjustment in an analog front end 3 and further to the boosting of the RF component and a noise removal process, each performed therein for the purpose of waveform equalization. The analog reproduced signal subjected to the waveform equalization in the analog front end 3 is quantized in the A/D converter 4 to provide digital data. Hereinafter, digital signal processing is performed in the subsequent stages.

In the digital signal processing circuit 12, the reproduced data quantized in the A/D converter 4 is subjected to a waveform correcting process through the digital filter 5 and decoded by the decoder 6 to provide binary data. The reproduced data quantized in the A/D converter 4 is also inputted to the synchronous clock extracting circuit 13.

In the synchronous clock extracting circuit 13, the frequency comparator 10 calculates a frequency error between the reproduced data and the clock outputted from the VCO 9, while the loop filter 11 filters the frequency error outputted from the frequency comparator 10. The VCO 9 changes the frequency of the clock outputted therefrom in accordance with the value of the frequency error smoothed by the loop filter 11. Likewise, the phase comparator 7 calculates the phase error between the reproduced data and the clock outputted from the VCO 9 and the loop filter 8 filters the phase error outputted from the phase comparator 7. The VCO 9 changes the frequency of the clock outputted therefrom in accordance with the value of the phase error smoothed by the loop filter 8. This feedback loop performs a control operation such that each of the frequency error and phase error of the clock outputted from the VCO 9 becomes zero. The synchronous clock extracting circuit 13 operates to perform frequency error correction first and then perform phase error correction. The clock outputted from the VCO 9 is supplied also to the digital signal processing circuit 12 including the A/D converter 4. When each of the frequency control and the phase control comes into a steady state, the output clock from the VCO 9 becomes a synchronous clock which is synchronized with the reproduced data.

A conventional structure of the phase comparator 7 in such a synchronous clock extracting circuit is disclosed in, e.g., Japanese Laid-Open Patent Publication No. HEI 8-17145. An example of the conventional structure of the phase comparator 7 will be shown herein below in FIG. 24.

In the drawing, the phase comparator 7 is composed of a zero cross detecting circuit 74 and a phase error calculating circuit 75. The zero cross detecting circuit 7 detects a zero cross point from the reproduced data and outputs a zero cross detection signal. The phase error calculating circuit 75 receives the reproduced data and the zero cross detection signal as an input signal and an enable signal, respectively, and outputs phase error data at the timing of the zero cross detection signal.

Subsequently, an example of the conventional structure of the zero cross detecting circuit 74 will be shown in FIG. 25. The zero cross detecting circuit 74 in the drawing is composed of an averaging circuit 741, a D flip-flop 742, and an EXCUSIVE-OR circuit 743. The averaging circuit 741 calculates an average value of two consecutive items of reproduced data and outputs the sign data thereof. The D flip-flop 742 delays the sign data from the averaging circuit 741 by a period corresponding to 1 clock. The sign data EXCLUSIVE-OR circuit 743 receives two sign data items which are the sign data of the average value outputted from the averaging circuit 741 and the sign data delayed in the D flip-flop 742 and detects points at which the signs of the sign data items are inverted from a positive value to a negative value and from a negative value to a positive value. An output from the EXCLUSIVE-OR circuit 743 is used as the zero cross detection signal from the zero cross detecting circuit 74.

An example of the outline of zero cross point detection in the zero cross detecting circuit 74 is shown in FIG. 26. The drawing shows the outline of zero cross point detection upon the rising of reproduced data. The circular marks indicate sampling points for the reproduced data, which are represented as $a(n-1)$, $a(n)$, and $a(n+1)$ with a lapse of time. The zero cross point detected as a phase error in this case is $a(n)$. Each of the crossed (X) marks indicates an average value of two consecutive sign data items. Since the average value of the sign data $a(n-1)$ and the subsequent sign data $a(n)$ has a positive sign and the average value of the sign data $a(n)$ and the subsequent sign data $a(n+1)$ has a negative sign, the sign data $a(n)$ in the middle is determined to be the zero cross point. The phase error is calculated based on the value of the sign data $a(n)$ and the direction of a cross edge.

Problem to be Solved

The problem of a conventional zero cross detection method is shown in FIGS. 27(a) and 27(b). The drawings show the outline of zero cross detection performed with respect to a (3T+3T) reproduced waveform (T is a channel cycle period), of which FIG. 27(a) shows the outline of zero cross detection that has been performed normally by using the zero cross detection method illustrated with reference to FIG. 26. As can be seen from the drawing, a zero cross point is detected correctly when the reproduced data and the sampling clock are in synchronization. By contrast, when a frequency error between the reproduced data and the sampling clock is large as shown in FIG. 27(b), phase inversion occurs at a given point so that the zero cross point is detected erroneously.

Thus, the conventional phase error comparison method has the problem of a narrow capture range due to a narrow input linear range.

DISCLOSURE OF THE INVENTION

An object of the present invention is to solve the problem mentioned above and thereby precisely detect the zero cross point even in the case where the reproduced data and the sampling clock are out of synchronization.

To attain the object, the present invention does not use the zero cross detection method in a situation in which the reproduced data and the sampling clock are out of synchronization but uses phase error data detected in the preceding process as a reference value to detect a cross timing for the reproduced data which crosses the reference value.

Specifically, a phase error detecting circuit according to the present invention is for use in extracting, based on reproduced data that has been reproduced from a record reproducing apparatus and quantized, a synchronous clock which is synchronized with the reproduced data and comprises: a cross detector for receiving the reproduced data and a specified reference value and detecting a cross timing at which the reproduced data crosses the reference value; a phase error calculator for receiving the reproduced data and a cross timing signal from the cross detector and calculating a difference between the value of the reproduced data and a zero value at the cross timing as phase error data; and a cross reference value generator for receiving the phase error data from the phase error calculator and updating the reference value of the cross detector based on the phase error data.

In the phase error detecting circuit according to the present invention, the cross reference value generator updates, every time the phase error calculator calculates the phase error data, the calculated latest phase error data as the reference value for the cross detector.

In the phase error detecting circuit according to the present invention, the cross detector has: a rising cross detector for detecting a rising cross timing at which the reproduced data crosses the reference value upon rising thereof; and a falling cross detector for detecting a falling cross timing at which the reproduced data crosses the reference value upon falling thereof.

In the phase error detecting circuit according to the present invention, the phase error calculator calculates, upon receipt of a rising cross timing signal from the rising cross detector, a difference between the value of the reproduced data and the reference value at the rising cross timing as rising phase error data and calculates, upon receipt of a falling cross timing signal from the falling cross detector, a difference between the value of the reproduced data and the reference value at the falling cross timing as falling phase error data.

In the phase error detecting circuit according to the present invention, the cross reference value generator receives the rising phase error data and the falling phase error data each from the phase error calculator and outputs the rising phase error data as a rising reference value to the rising cross detector, while outputting the falling phase error data as a falling reference value to the falling cross detector.

In the phase error detecting circuit according to the present invention, the cross reference value generator receives the rising phase error data from the phase error calculator, outputs the rising phase error data as a rising reference value to the rising cross detector, and outputs rising phase error data obtained by inverting the sign of the rising phase error data as a falling reference value to the falling cross detector.

In the phase error detecting circuit according to the present invention, the cross reference value generator receives the falling phase error data from the phase error calculator, outputs falling phase error data obtained by inverting the sign of the falling phase error data as a rising reference value to the rising cross detector, and outputs the falling phase error data as a falling reference value to the falling cross detector.

In the phase error detecting circuit according to the present invention, the cross reference value generator receives the rising phase error data and the falling phase error data from the phase error calculator, calculates a ½ value of a sum of the inputted rising phase error data and falling phase error data, and outputs the ½ value of the sum and a value obtained by inverting the sign of the ½ value of the sum as a rising reference value and a falling reference value, to the rising cross detector and to the falling cross detector.

In the phase error detecting circuit according to the present invention, the cross reference value generator has a structure which fixes the reference value for the cross detector to zero and the phase error detecting circuit further comprises: a control signal generator for outputting a control signal to the cross reference value generator such that switching is performed between updating of the reference value based on the phase error data and the fixing of the reference value to zero in the cross reference value generator.

In the phase error detecting circuit according to the present invention, the control signal generator receives the phase error data from the phase error calculator and generates the control signal such that switching is performed between the updating of the reference value based on the phase error data and the fixing of the reference value to zero in the cross reference value generator depending on a phase error shown by the phase error data.

In the phase error detecting circuit according to the present invention, the control signal generator outputs a control signal such that, when the phase error shown by the received phase error data becomes less than a specified value and approaching a steady state, the generation of the reference value is switched from the updating of the reference value based on the phase error data to the fixing of the reference value to zero.

In the phase error detecting circuit according to the present invention, the control signal generator generates the control signal such that the reference value is updated based on the phase error data when the phase error shown by the received phase error data is not less than a specified threshold and that the reference value is fixed to zero when the phase error shown by the received phase error data is less than the specified threshold.

In the phase error detecting circuit according to the present invention, the control signal generator receives a specified signal from an outside of the phase error detecting circuit and generates the control signal such that switching is performed between the updating of the reference value based on the phase error data and the fixing of the reference value to zero in the cross reference value generator in accordance with the specified signal from the outside.

In the phase error detecting circuit according to the present invention, the control signal generator outputs the control signal such that the generation of the reference value is switched from the updating of the reference value based on the phase error data to the fixing of the reference value to zero upon receipt of a signal which is outputted when a specified pattern of the reproduced data is detected as the specified signal from the outside.

In the phase error detecting circuit according to the present invention, the signal which is outputted when the specified pattern of the reproduced signal is detected is a sink detection signal which is generated upon detection of a spacing between sink marks in an optical disk.

In the phase error detecting circuit according to the present invention, the control signal generator receives an abnormal detection signal which is generated when an abnormality occurs in the reproduced data and resets the reference value which is updated based on the phase error data in the cross reference value generator to a specified value.

In the phase error detecting circuit according to the present invention, the control signal generator receives the phase error data from the phase error calculator and a specified signal from an outside of the phase error detecting circuit and generates the control signal such that switching is performed between the updating of the reference value based on the phase error data and the fixing of the reference value to zero in the cross reference value generator in accordance with the phase error shown by the phase error data and with the specified signal from the outside.

A synchronous clock extracting circuit according to the present invention comprises: the phase error detecting circuit described above and a voltage control oscillator for receiving the phase error data outputted from the phase error detecting circuit and changing a frequency of a synchronous clock in accordance with a phase error shown by the phase error data.

The phase error detecting circuit according to the present invention further comprises: a threshold generator for generating a threshold used to update the reference value for the cross detector, wherein the cross reference value generator receives the threshold from the threshold generator and updates the reference value for the cross detector based on the threshold and on the phase error data from the phase error calculator.

In the phase error detecting circuit according to the present invention, the threshold generator receives the phase error data from the phase error calculator and specified threshold data from an outside and uses the smaller one of an absolute value of the phase error data and an absolute value of the specified threshold data as the threshold.

In the phase error detecting circuit according to the present invention, the threshold generator generates a threshold for rising cross timing and a threshold for falling cross timing.

In the phase error detecting circuit according to the present invention, the cross detector has: a rising cross detector for detecting a rising cross timing at which the reproduced data crosses the reference value upon rising thereof; and a falling cross detector for detecting a falling cross timing at which the reproduced data crosses the reference value upon falling thereof.

In the phase error detecting circuit according to the present invention, the phase error calculator receives a rising cross timing signal from the rising cross detector and calculates a difference between the value of the reproduced data and the reference value at the rising cross timing as rising phase error data and receives a falling cross timing signal from the falling cross detector and calculates a difference between the value of the reproduced data and the reference value at the falling cross timing as falling phase error data.

In the phase error detecting circuit according to the present invention, the cross reference value generator receives the rising phase error data from the phase error calculator and the threshold for rising cross timing from the threshold generator and uses the smaller one of an absolute value of the rising phase error data and an absolute value of the threshold for rising cross timing as a rising reference value and receives the falling phase error data from the phase error calculator and the threshold for falling cross timing from the threshold generator and uses the smaller one of an absolute value of the falling phase error data and an absolute value of the threshold for falling cross timing as a falling reference value.

In the phase error detecting circuit according to the present invention, the cross reference value generator receives the rising phase error data from the phase error calculator and the threshold for rising cross timing from the threshold generator and uses the smaller one of an absolute value of the rising phase error data and an absolute value of the threshold for rising cross timing as a rising reference value, while using a value obtained by inverting the sign of the rising reference value as a falling reference value.

In the phase error detecting circuit according to the present invention, the cross reference value generator receives the falling phase error data from the phase error calculator and the threshold for falling cross timing from the threshold generator and uses the smaller one of an absolute value of the falling phase error data and an absolute value of the threshold for falling cross timing as a falling reference value, while using a value obtained by inverting the sign of the falling reference value as a rising reference value.

In the phase error detecting circuit according to the present invention, the cross reference value generator has: an absolute-value-average calculating circuit for calculating an average value of two absolute values which are the smaller one of an absolute value of the rising phase error data from the phase error calculator and an absolute value of the threshold for rising cross timing from the threshold generator and the smaller one of an absolute value of the falling phase error data from the phase error calculator and an absolute value of the threshold for falling cross timing from the threshold generator and uses the average value of the two absolute values calculated in the absolute-value-average calculating circuit as each of a rising reference value and a falling reference value.

In the phase error detecting circuit according to the present invention, the cross reference value generator has, as the reference value for the cross detector, a zero reference value in addition to the reference value based on the threshold from the threshold generator and on the phase error data from the phase error calculator and has a selecting circuit for selecting either one of the zero reference value and the reference value based on the threshold and on the phase error data.

The phase error detecting circuit according to the present invention further comprises: a control signal generator for generating a control signal such that the selecting circuit of the cross reference value generator is switched to the zero reference value.

In the phase error detecting circuit according to the present invention, the control signal generator receives the phase error data calculated in the phase error calculator, generates the control signal when the phase error data has converged to be less than a specified value, and outputs the control signal to the selecting circuit of the cross reference value generator.

In the phase error detecting circuit according to the present invention, when the record reproducing apparatus is reproducing data from an optical disk, the control signal generator generates the control signal upon detection of a spacing between sink marks recorded in the optical disk and outputs the control signal to the selecting circuit of the cross reference value generator.

In the phase error detecting circuit according to the present invention, the threshold generator comprises: a decremental circuit for gradually decreasing a specified threshold; a selecting circuit for selecting either one of the specified threshold and a threshold resulting from the decreasing of the specified threshold by the decremental circuit; and a switching signal generator for generating a switching signal for switching the selecting circuit to a position of the decremental circuit.

In the phase error detecting circuit according to the present invention, the switching signal generator generates the switching signal when the number of occurrences of zero crossing of the reproduced data is less than a specified value during a specified period and outputs the generated witching signal to the selecting circuit.

In the phase error detecting circuit according to the present invention, the threshold generator has a selecting circuit for receiving a control signal from an outside and selecting a threshold with a zero value.

In the phase error detecting circuit according to the present invention, the cross reference value generator has a gain adjusting circuit for adjusting a value of the phase error data from the phase error calculator to a specified multiple of the original value.

A synchronous clock extracting circuit according to the present invention comprises: the phase error detecting circuit described above and a voltage control oscillator for receiving the phase error data outputted from the phase error detecting circuit and changing a frequency of a synchronous clock in accordance with a phase error shown by the phase error data.

Thus, the present invention performs a feedback operation by using the phase error data detected in the preceding process, updates the reference value, and uses reproduced data at a timing at which the reference value crosses a reproduced signal as the next cross detection signal to detect the phase error data of the cross detection signal. Consequently, even in a situation in which the reproduced data and the sampling clock are out of synchronization, the phase error can be detected precisely and the capture range can be enlarged.

In particular, the present invention allows a shift to the zero cross method which generates the cross timing of the reproduced signal and the zero value as a cross detection signal after the phase error becomes smaller and approaching a steady state. As a result, the detection of the phase error can be performed efficiently and stably.

In addition, in the case where the phase error data detected in the preceding process is used as the reference value, when the reference value is larger than a set threshold, the present invention has limited the reference value to the set threshold and constrained the adopted reference value to a proper range. This suppresses the enhancement of a jitter in the reproduced signal and allows more precise detection of the phase error.

BEST MODES FOR CARRYING OUT THE INVENTION

Figure 1:
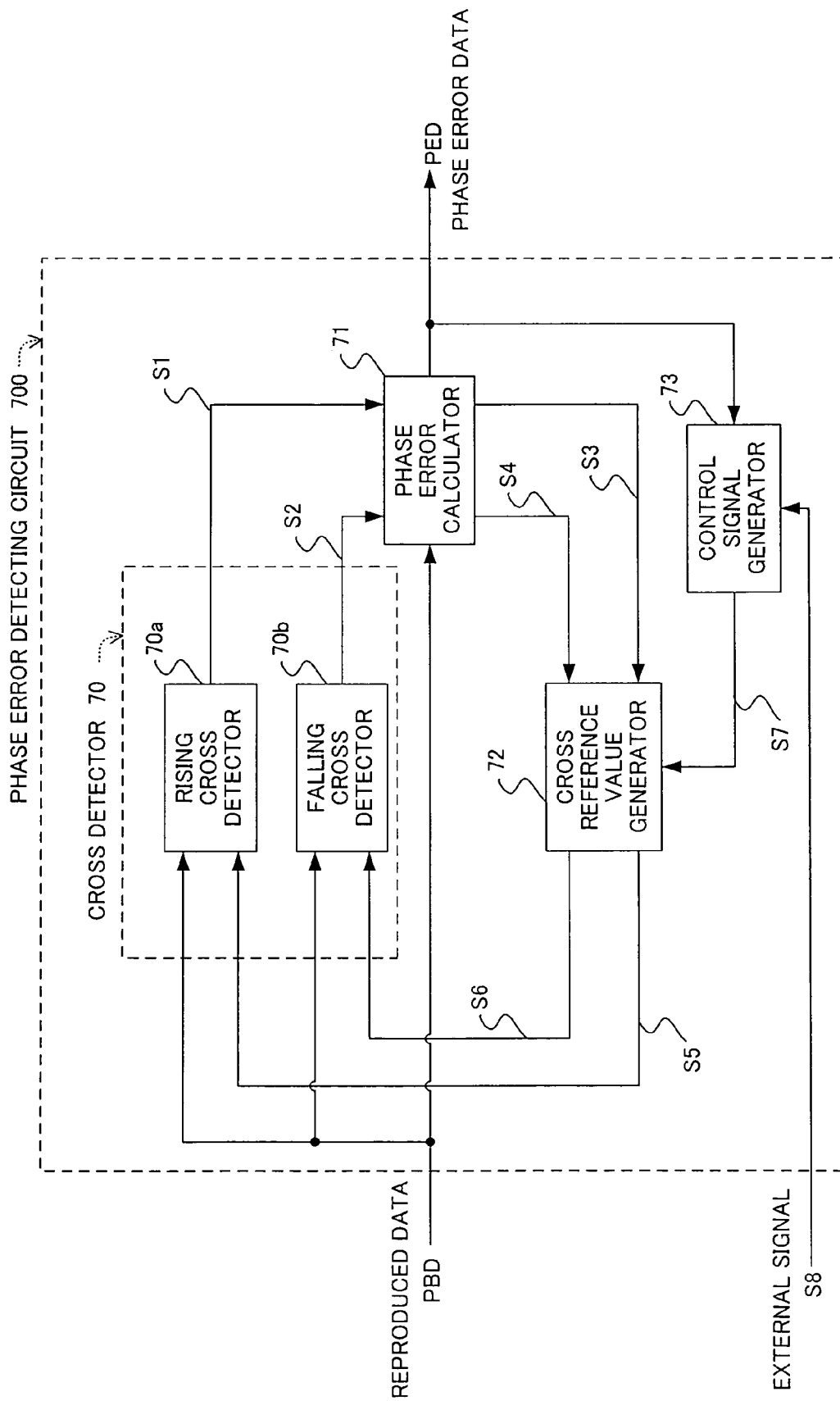
FIG. 1 is a view showing a phase error detecting circuit according to a first embodiment of the present invention.

Referring to the drawings, the embodiments of the present invention will be described herein below.

Embodiment 1

FIG. 1 shows a structure of a phase error detecting circuit as a first embodiment of the present invention. The phase error detecting circuit in the drawing is used as a replacement for the phase comparator 7 provided in the synchronous clock extracting circuit 13 of the digital signal processing circuit 12 in the reproduced signal processing circuit in the optical disk apparatus (record reproducing apparatus) shown in FIG. 23. Accordingly, the respective structures of the synchronous clock extracting circuit and the reproduced signal processing circuit each having the phase error detecting circuit are the same as in FIG. 23 so that the description thereof will be omitted.

Figure 23:
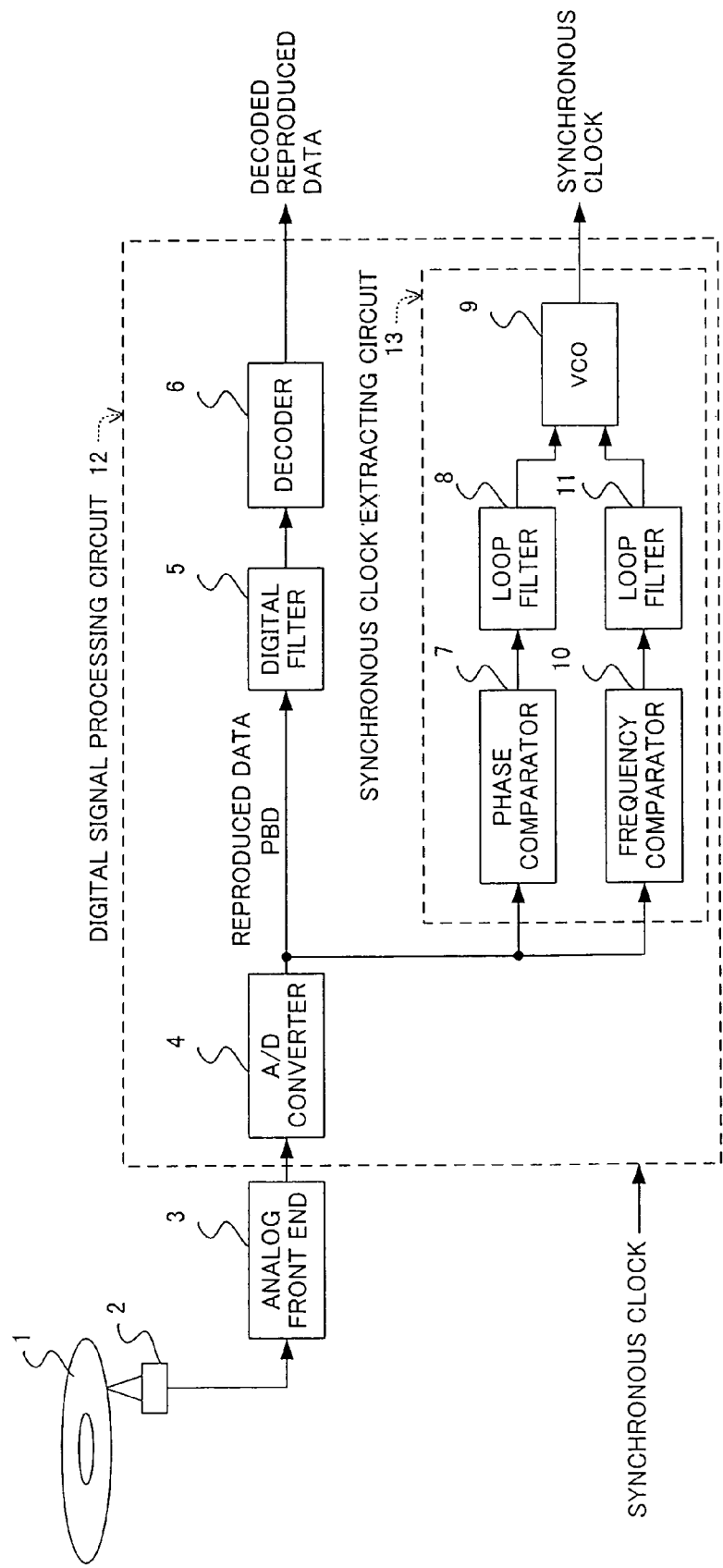
FIG. 23 is a view showing a reproduced signal processing circuit for a typical conventional optical disk.
Figure 24:
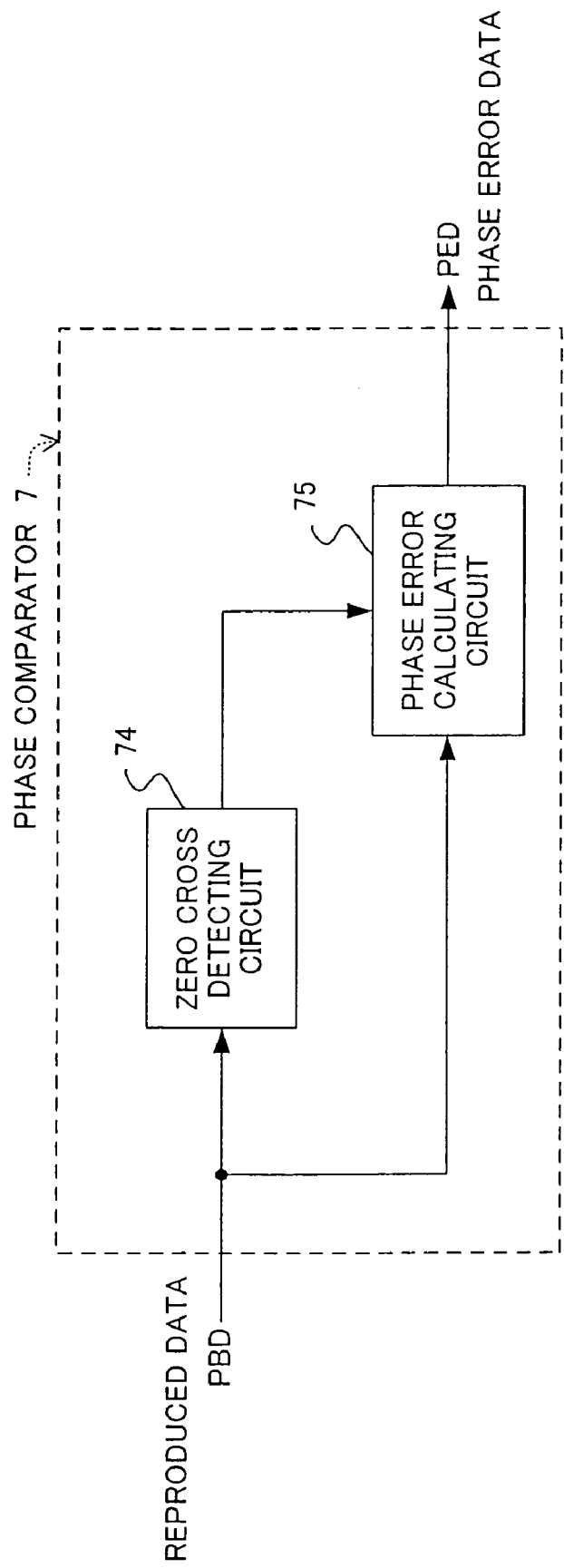
FIG. 24 is a view showing an internal structure of a phase comparator provided in the conventional reproduced signal processing circuit.
Figure 25:
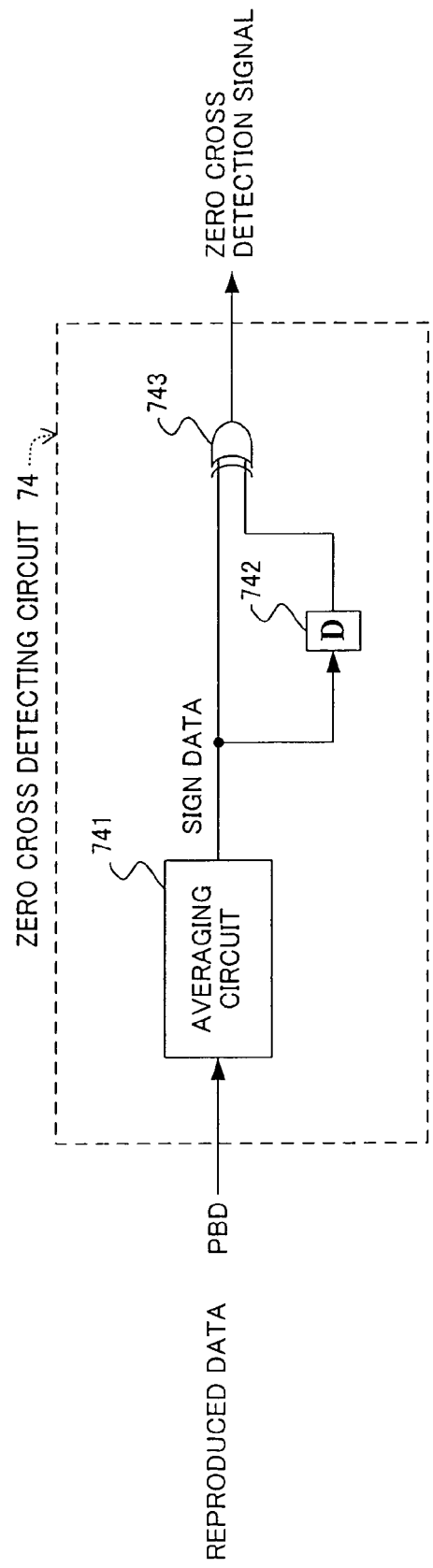
FIG. 25 is a view showing an internal structure of a zero cross detecting circuit provided in the conventional phase comparator.
Figure 26:
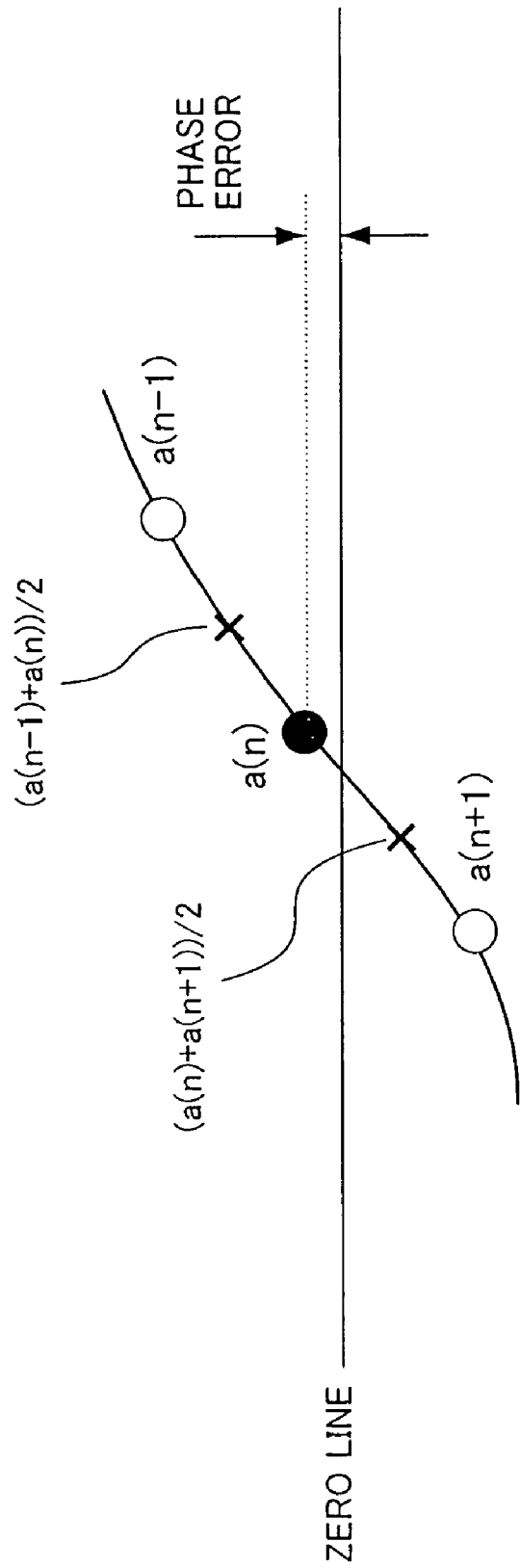
FIG. 26 is a view showing the outline of a zero cross detection method for the conventional phase comparator.
Figure 27:
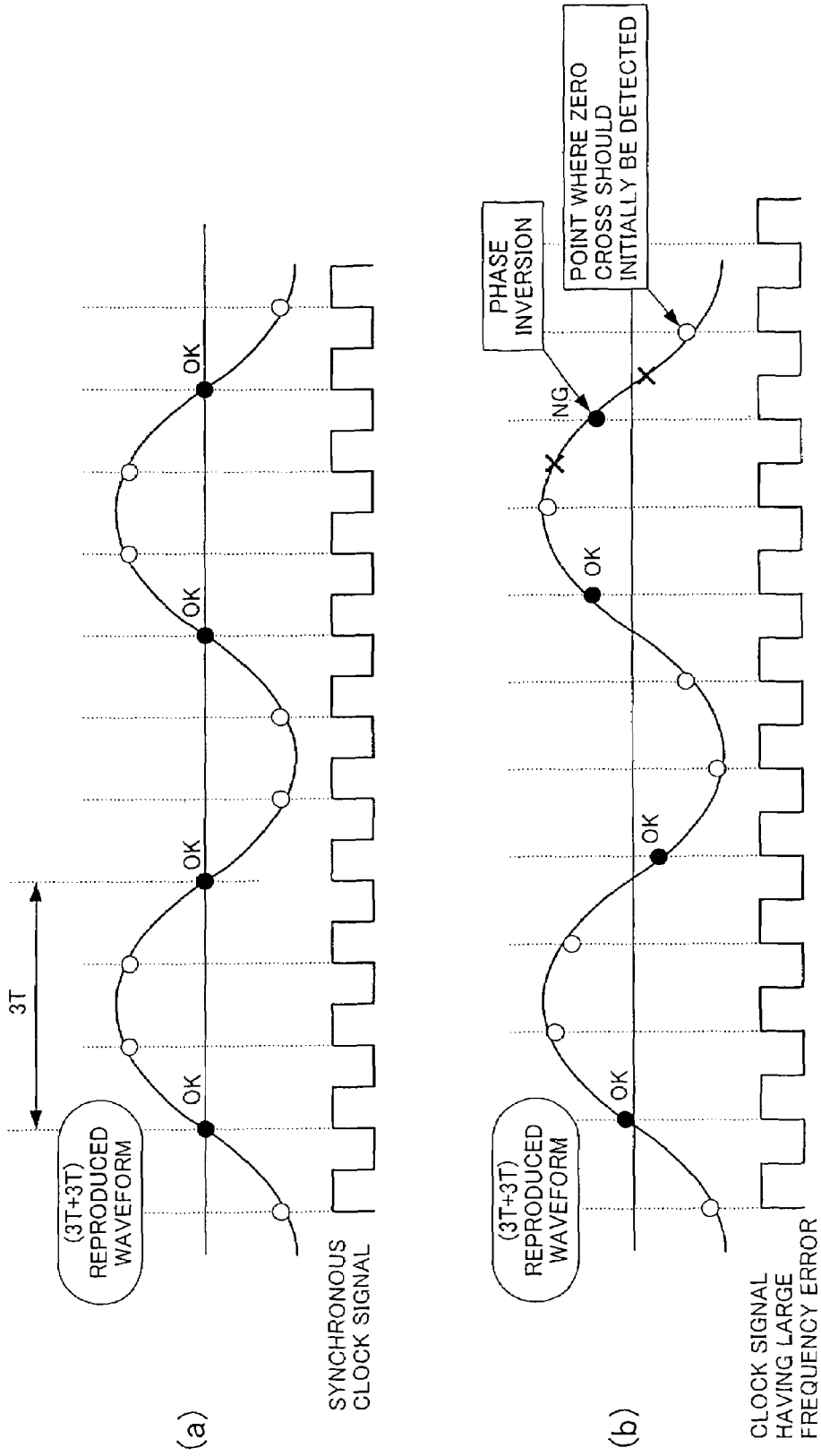
FIG. 27($a$) is a view illustrating zero cross detection performed normally in the conventional phase comparator when reproduced data and sampled data are in synchronization and FIG. 27($b$) is a view illustrating the occurrence of erroneous detection at a zero cross point when a frequency error between the reproduced data and the sampled data is large.

In FIG. 1, 700 is the phase error detecting circuit which detects a phase error from the reproduced data reproduced by the record reproducing apparatus and subjected to AD conversion (quantization) in the A/D converter 4 shown in FIG. 23 and outputs the detected phase error. The phase error detecting circuit 700 is provided in the synchronous clock extracting circuit 13 shown in FIG. 23 in place of the phase comparator 7 so that phase error data outputted from the phase error detecting circuit 700 is inputted to the VCO (voltage control oscillator) 9 via the loop filter 8, as described above, and the VCO 9 changes the frequency of the synchronous clock outputted therefrom in accordance with the phase error of the inputted phase error data.

In the phase error detecting circuit 700 of FIG. 1, 70 is a cross detector which performs cross detection from the quantized reproduced data and is internally provided with a rising cross detector 70a for performing cross detection upon the rising of the reproduced data and a falling cross detector 70b for similarly performing cross detection upon the falling of the reproduced data. 71 is a phase error calculator, 72 is a cross reference value generator, and 73 is a control signal generator. On the other hand, PBD is reproduced data, PED is phase error data, S1 is a rising cross detection signal outputted from the rising cross detector 70a, S2 is a falling cross detection signal outputted from the falling cross detector 70b, S3 is rising phase error data outputted from the phase error calculator 71, S4 is falling phase error data similarly outputted from the phase error calculator 71, S5 is a rising cross reference value outputted from the cross reference value generator 72, S6 is a falling cross reference value similarly outputted from the cross reference value generator 72, S7 is a control signal outputted from the control signal generator 73, and S8 is an external signal from an external circuit of the phase error detecting circuit 700.

Figure 2:
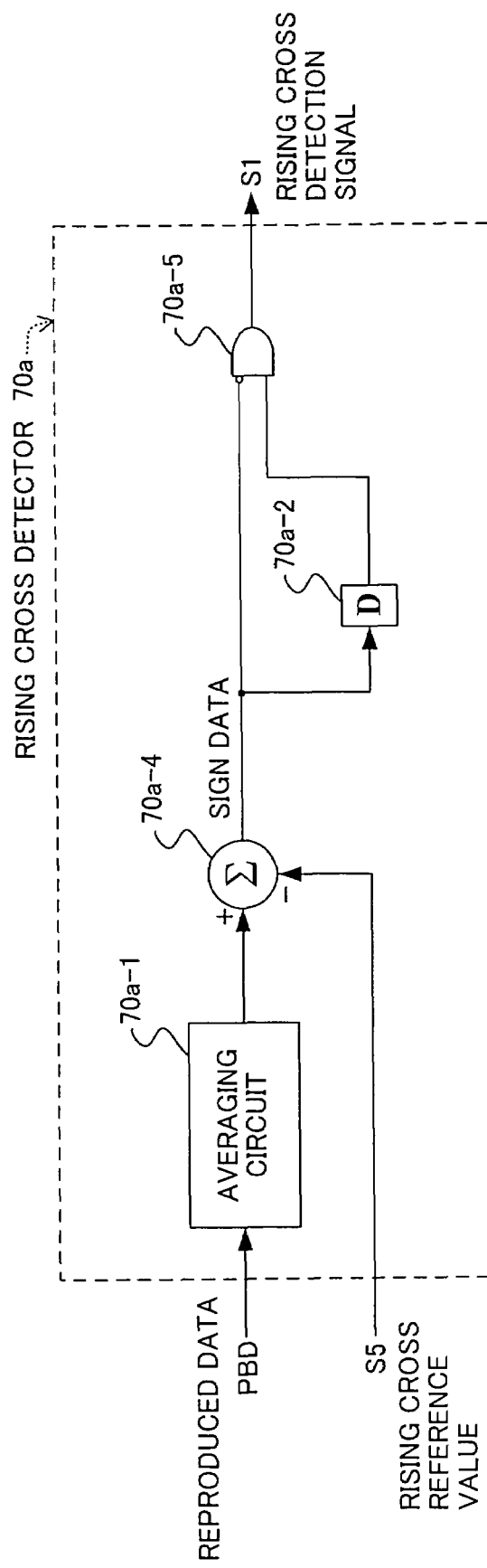
FIG. 2 is a view showing an internal structure of a rising cross detector provided in the phase error detecting circuit.

An example of an internal structure of the rising cross detector 70a provided in the foregoing cross detector 70 is shown next in FIG. 2. In the rising cross detector 70a, 70a-1 is an averaging circuit which calculates an average value of two consecutive reproduced data items, 70a-2 is a D flip-flop, 70a-4 is a subtractor, 70a-5 is a logic circuit, PBD is the reproduced data, S1 is the rising cross detection signal, and S5 is the rising cross reference value. The falling cross detector 70b also has the same internal structure as the rising cross detector 70a. Herein below, the structure of the rising cross detector 70a will be described in conjunction with the rising-cross detecting operation thereof.

First, the quantized reproduced data PBD and the rising cross reference value S5 are inputted to the rising cross detector 70a. The averaging circuit 70a-1 calculates the average value of the two consecutive reproduced data items PBD. Then, the subtractor 70a-4 subtracts the rising cross reference value S5 from the average value obtained in the averaging circuit 70a-1 and outputs sign data obtained based on the rising cross reference value S5. Subsequently, the logic circuit 70a-5 receives the sign data delayed by 1 clock in the D flip-flop 70a-2 and the sign data outputted from the subtractor 70a-4, i.e., the two temporally consecutive items of sign data and detects points (cross timings) at which the respective signs of the two items of sign data change from negative values to positive values based on the rising cross reference value S5. An output from the logic circuit 70a-5 is used as the rising cross detection signal S1 from the rising cross detector 70a. Likewise, the falling cross detector 70b also detects points at which the sign data items inputted to the logic circuit 70a-5 change from positive values to negative values and outputs the rising cross detection signal S2.

Figure 3:
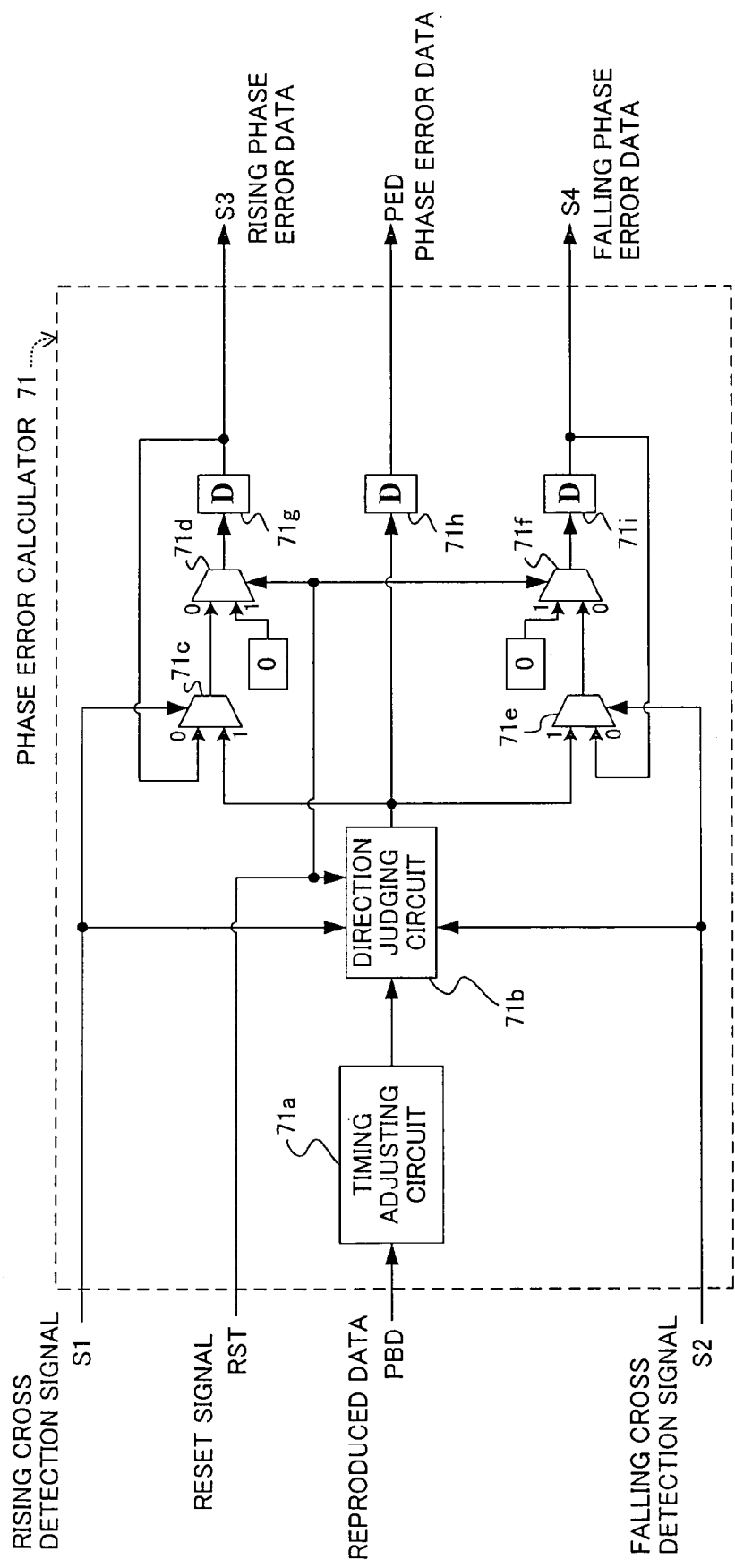
FIG. 3 is a view showing an internal structure of a phase error calculator provided in the phase error detecting circuit.

An example of an internal structure of the phase error calculator 71 shown in FIG. 1 is shown next in FIG. 3. In the phase error calculator 71 in the drawing, 71a is a timing adjusting circuit, 71b is a direction judging circuit, 71c to 71f are selectors, 71g to 71i are D flip-flops, PBD is the reproduced data, PED is the phase error data, S1 is the rising cross detection signal, S2 is the falling cross detection signal, S3 is the rising phase error data, S4 is the falling phase error data, and RST is a reset signal.

A description will be given herein below to a detailed structure of the phase error calculator 71 shown in FIG. 3 and the phase-error calculating operation thereof. First, the reproduced data PBD, the rising cross detection signal S1, the falling cross detection signal S2, and the reset signal RST are inputted to the phase error calculator 71. The timing adjusting circuit 71a adjusts the timing of the inputted reproduced data PBD and outputs the adjusted timing. The direction judging circuit 71b judges the direction of the reproduced data PBD with the adjusted timing which is either the rising cross or the falling cross and outputs the value of the reproduced data PBD, i.e., the difference between the value of the reproduced data and the zero value as the phase error data PED via the D flip-flop 71h. When the direction judging circuit 71b judges that the direction of the change is the rising cross, it outputs the value of the reproduced data PBD as the rising phase error data S3 via the two selectors 71c and 71d and the D flip-flop 71g. On the other hand, when the direction judging circuit 71b judges that the direction of the change is the falling cross, it outputs the value of the reproduced data PBD as the falling phase error data S4 via the two selectors 71e and 71f and the D flip-flop 71i.

In the foregoing phase error calculator 71, the selector 71c for the rising phase error data S3 receives the rising cross detection signal S1 and selects the reproduced data PBD from the direction judging circuit 71b when the value of the signal S1 is "1", while selecting data (the preceding reproduced data PBD) held in the D flip-flop 71g when the value of the signal S1 is "0". The other selector 71d for the rising phase error data S3 selects data from the selector 71c in a normal state in which the value of the reset signal RST is "0", while selecting the zero value when the value of the reset signal RST has been reset to "1". The selectors 71e and 71f for the falling phase error data S4 also have the same structures as described above.

Figure 4:
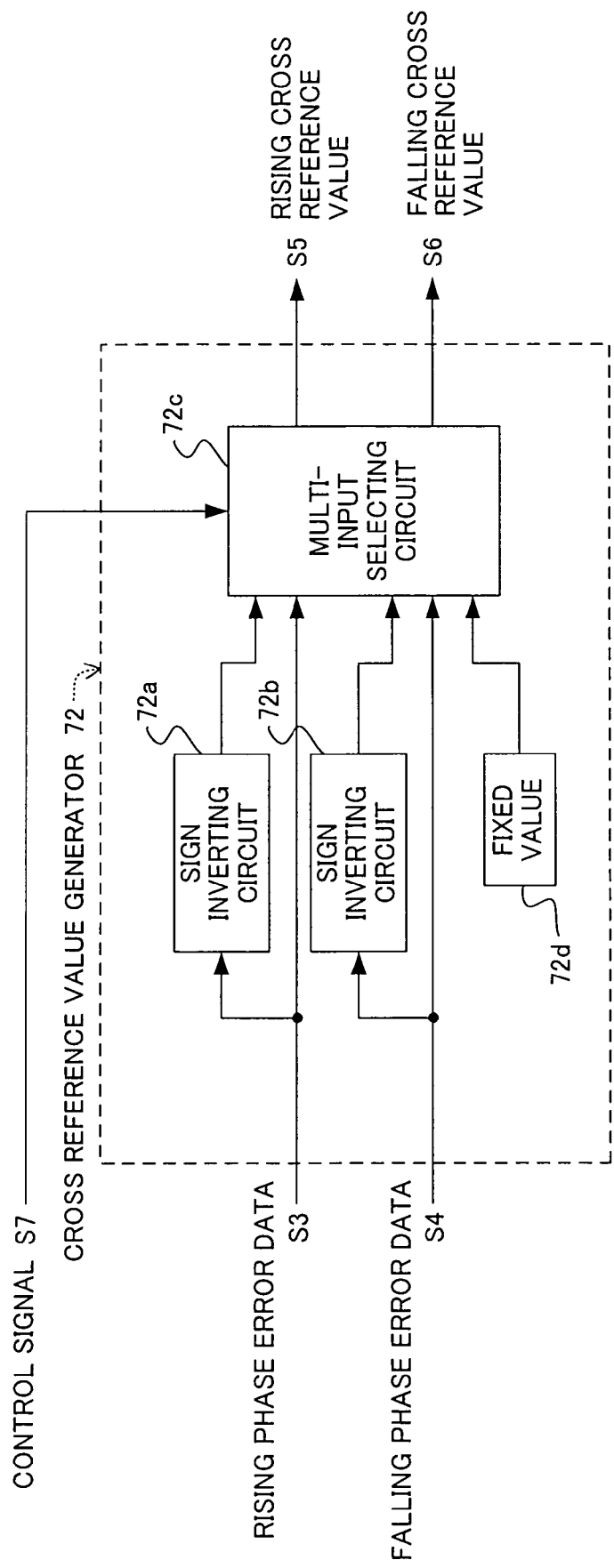
FIG. 4 is a view showing an internal structure of a cross reference value generator provided in the phase error detecting circuit.

An example of the structure of the cross reference value generator 72 shown in FIG. 1 is shown next in FIG. 4. In the cross reference value generator 72, 72a and 71b are sign inverting circuits, 72c is a multi-input selecting circuit composed of a selector, and 72d is a zero value used as a given fixed value to fix the reference value to the zero value. S3 is the rising phase error data, S4 is the falling phase error data, S5 is the rising cross reference value, S6 is the falling cross reference value, and S7 is the control signal.

A description will be given next to a detailed structure of the foregoing cross reference value generator 72 of FIG. 4 and the cross-reference-value generating operation thereof.

First, the latest rising phase error data S3 and falling phase error data S4 calculated in the phase error calculator 71 and the control signal S7 are inputted to the cross reference value generator 72. The multi-input selecting circuit 72c uses the control signal S7 as a select signal and switchably outputs any of the rising phase error data S3, data obtained by inverting the sign of the rising phase error data S3 in the sign inverting circuit 72a, the falling phase error data S4, and data obtained by inverting the sign of the falling phase error data in the sign inverting circuit 72b, i.e., the phase error data when the reference value is updated based on the phase error data or the fixed value when the reference value is fixed to the zero value as the fixed value 72d. The outputs of the multi-input selecting circuit 72c are used as they are as the rising cross reference value S5 and the falling cross reference value S6.

A description will be given to a sequence of phase-error-data detecting operation in the phase error detecting circuit 700 partly composed of the cross detector 70, the phase error calculator 71, and the cross reference value generator 72 described above.

The cross detector 70 receives the reproduced data, the rising cross reference value S5, and the falling cross reference value S6 and performs rising/falling cross detection in the rising cross detector 70a upon the rising of the reproduced data and in the falling cross detector 70b upon the falling of the reproduced data. The phase error calculator 71 receives the reproduced data and the rising and falling cross detection signals S1 and S2 each from the cross detector 70 and outputs the phase error data PED, the rising phase error data S3, and the falling phase error data S4. The cross reference value generator 72 receives the rising phase error data S3 and the falling phase error data S4 each from the phase error calculator 71 and outputs these data items as the latest rising/falling cross reference values S5 and S6. The reference values S5 and S6 are updated as the reference value for next cross detection.

Figure 5:
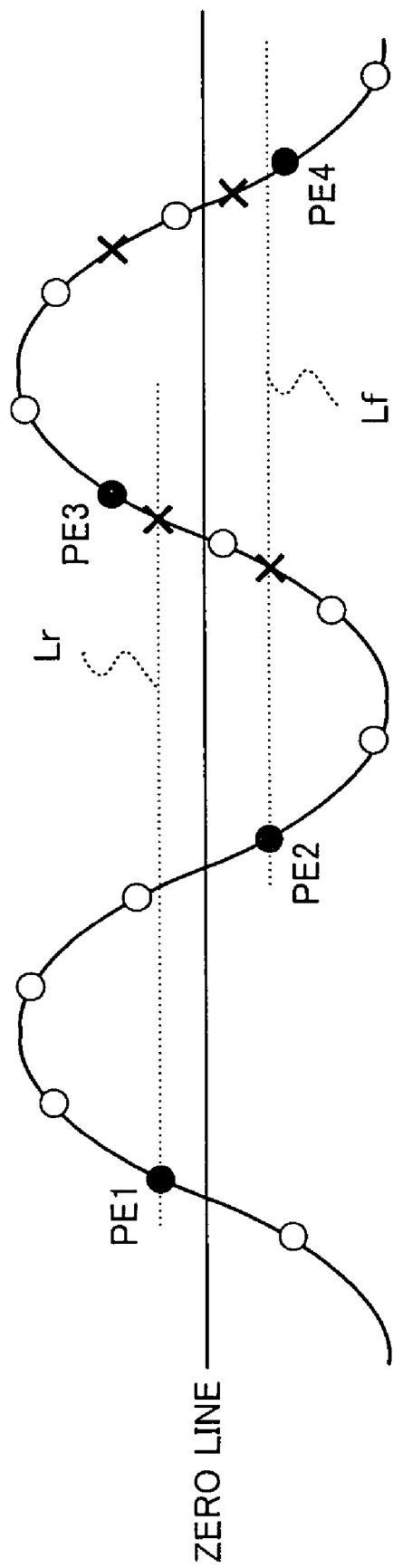
FIG. 5 is a view showing the outline of a phase error detection method for the phase error detecting circuit according to the first embodiment.

The outline of the foregoing phase error detection method will be described with reference to FIG. 5. In the drawing, the circular marks indicate sampling points for the reproduced data, of which the solid marks particularly indicate the sampling points of phase error data to be detected, Lr indicates the level of the rising cross reference value, and Lf indicates the level of the falling cross reference value. On the other hand, each of PE1, PE2, PE3, and PE4 indicates the sampling point of phase error data.

First, the level of the phase error data PE1 detected upon the rising thereof is designated as the rising reference value level Lr and used as the next rising cross reference value to detect the next rising phase error PE3. On the other hand, the level of the phase error data PE2 detected upon the falling thereof is designated as the falling reference value level Lf and used as the next falling cross reference value to detect the next falling phase error PE4.

In short, a feedback loop is formed in which the rising phase error data S3 and the falling phase error data S4 calculated one process before are used as the reference values for detecting the respective cross points of the rising/falling phase errors in the next reproduced data. By using the structure, the capture range of the phase error detecting circuit can be enlarged.

Embodiment 2

A description will be given next to a phase error detecting circuit in the second embodiment. In the present embodiment, the cross reference value generator 72 generates a reference value different from that used in the first embodiment.

Figure 6:
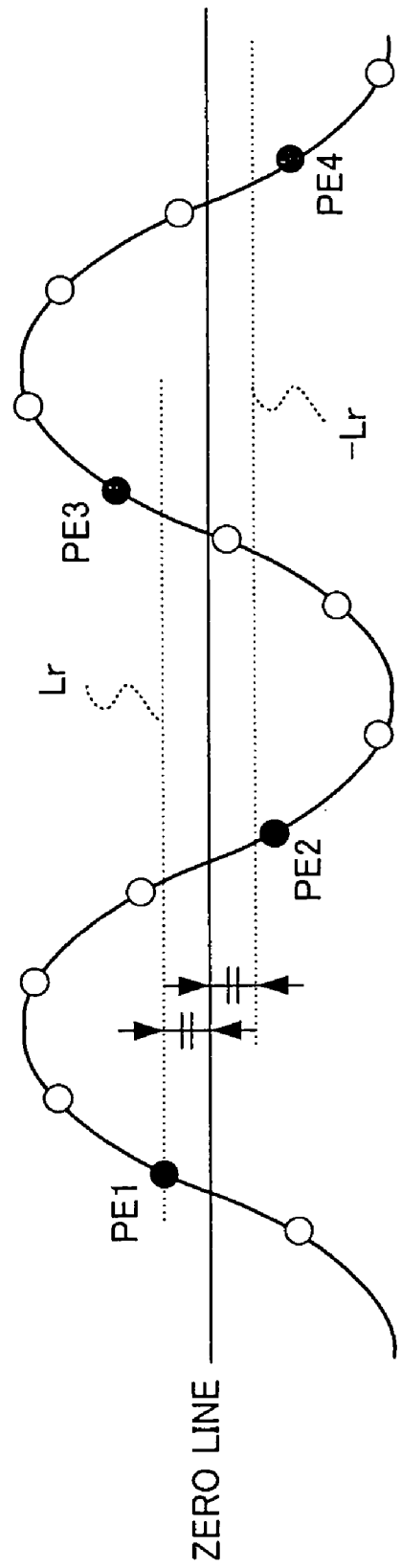
FIG. 6 is a view showing the outline of a phase error detection method for a phase error detecting circuit according to a second embodiment of the present invention.

Specifically, the rising cross reference value S5 is outputted to the rising cross detector 70a and the rising cross reference value S5 having an equal absolute value and an inverted sign is outputted to the falling cross detector 70b, which will be described with reference to FIG. 6. The phase error data point PE3 upon the next rising is detected by using the level Lr at the phase error data point PE1 upon rising as the reference value and, for the detection of the phase error data points PE2 and PE4 upon falling, a value obtained by inverting the sign of the level Lr at the phase error data point PE1 upon rising is used as the reference value.

Accordingly, the capture range of the phase error detecting circuit can be enlarged in the same manner as in the first embodiment.

Embodiment 3

A description will be given next to a phase error detecting circuit according to the third embodiment. In the present embodiment, another embodiment of the generation of the reference value will be shown.

Figure 7:
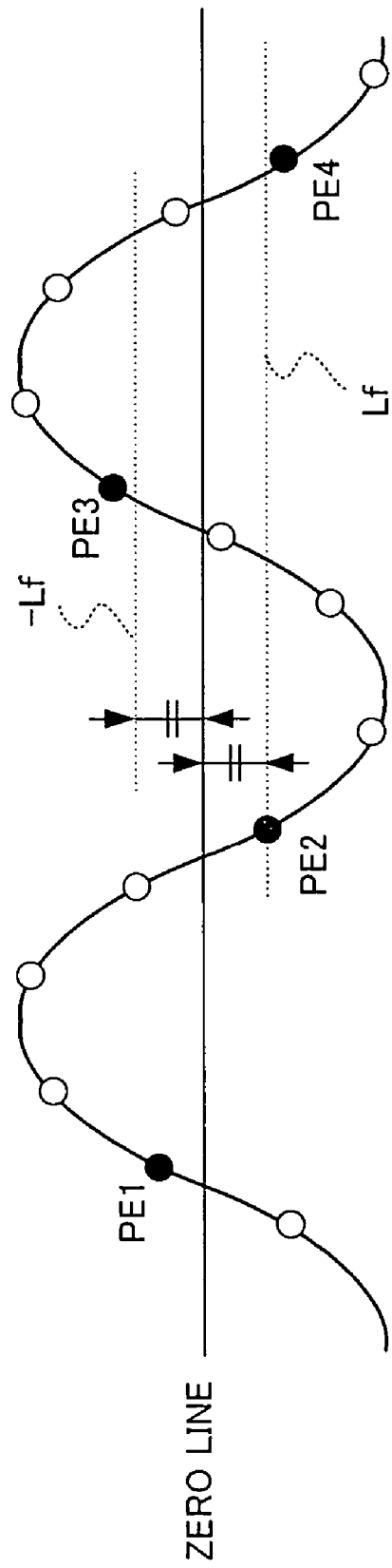
FIG. 7 is a view showing the outline of a phase error detection method for a phase error detecting circuit according to a third embodiment of the present invention.

Specifically, the falling cross reference value S6 is outputted to the falling cross detector 70b by using the falling phase error data S4 inputted to the cross reference value generator 72, while the falling cross reference value S6 having an equal absolute value and an inverted sign is outputted to the rising cross detector 70a, which will be described with reference to FIG. 7. By using the level Lf at the phase error data point PE2 detected upon falling as the reference value, the phase error data point PE4 is detected upon the next falling and, for the detection of the phase error data point PE3 upon rising, a value obtained by inverting the sign of the level Lf at the phase error data point PE2 upon falling is used as the reference value.

Accordingly, the capture range of the phase error detecting circuit can be enlarged in the same manner as in the first embodiment.

Embodiment 4

A description will be given next to a phase error detecting circuit in the fourth embodiment. In the present embodiment also, still another embodiment of the generation of the reference value will be shown.

Specifically, by using the rising phase error data S3 and the falling phase error data S4 each inputted to the cross reference value generator 72 of FIG. 1, the average value of these two data items is calculated. The calculated average value is outputted as the rising cross reference value S5 to the rising cross detector 70a, while a value obtained by imparting an inverted sign to the absolute value of the calculated average value is outputted as the falling cross reference value S6 to the falling cross detector 70b.

Figure 8:
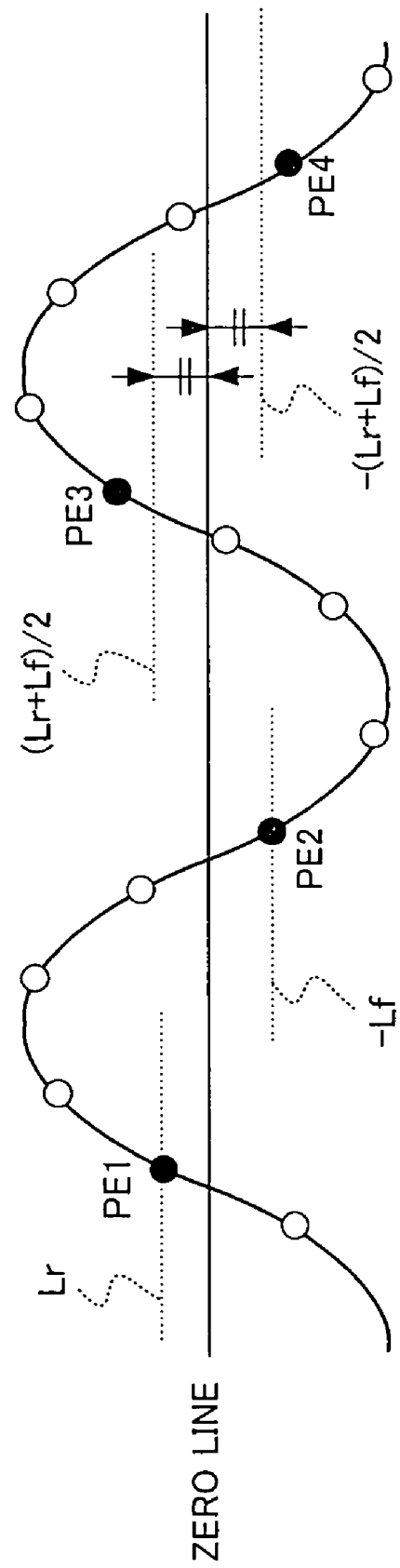
FIG. 8 is a view showing the outline of a phase error detection method for a phase error detecting circuit according to a fourth embodiment of the present invention.

The above-mentioned operation will be described with reference to FIG. 8. From the level Lr at the phase error data point PE1 detected upon rising and the level Lf at the phase error data point PE2 detected upon falling, an average value which is a ½ value of the sum thereof is calculated. As the reference value for detecting the phase error data point upon the next rising, the foregoing average value $(Lr+Lf)/2$ is used, while a value obtained by subtracting $(Lr+Lf)/2$ from the foregoing average value with an inverted sign is used as the reference value for detecting the phase error data point upon the next falling.

Accordingly, the capture range of the phase error detecting circuit can be enlarged in the same manner as in the first embodiment.

Embodiment 5

A description will be given next to a phase error detecting circuit according to the fifth embodiment. The present embodiment shows a specific structure of the control signal generator 73 of FIG. 1.

Figure 9:
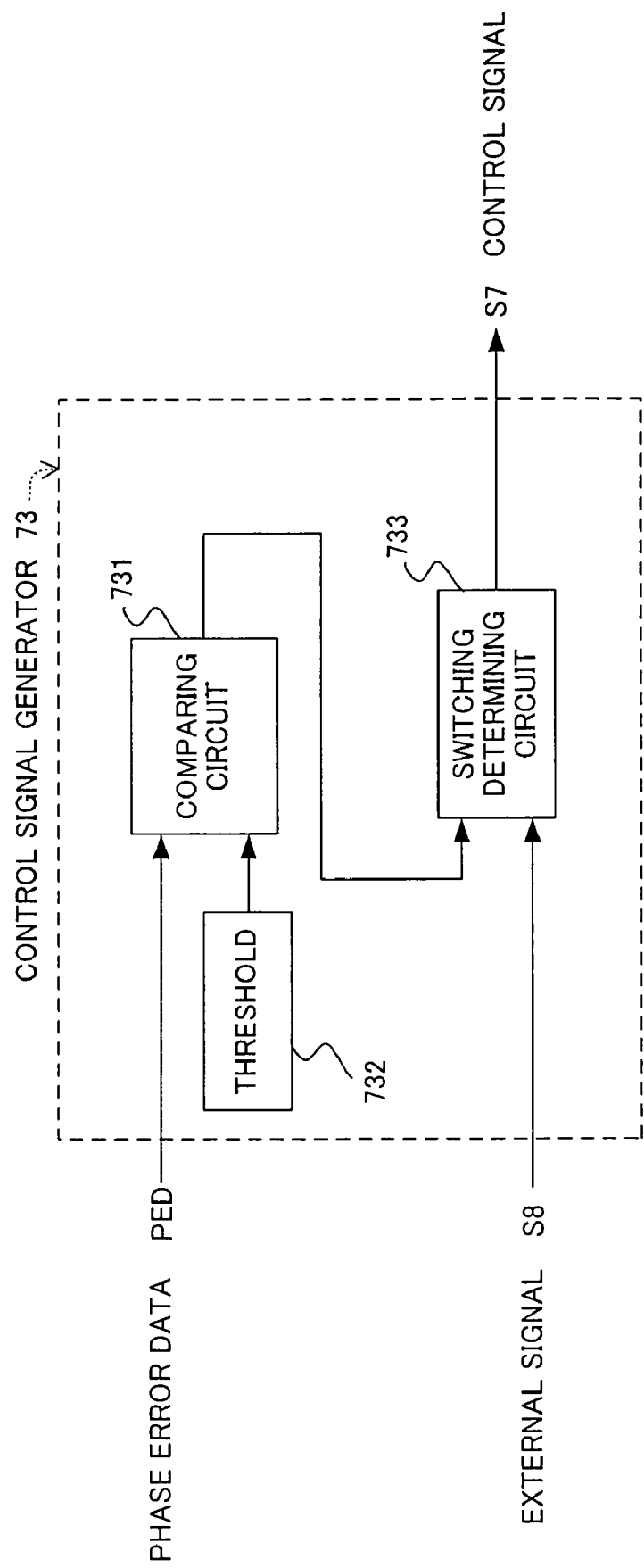
FIG. 9 is a view showing an internal structure of a control signal generator provided in the phase error detecting circuit according to the first embodiment.

An example of an internal structure of the control signal generator 73 is shown in FIG. 9. In the control signal generator 73 shown in the drawing, 731 is a comparing circuit, 732 is a threshold with a preliminarily specified value, 733 is a switching determining circuit, PED is the phase error data, S7 is the control signal, and S8 is the external signal.

A description will be given to the detailed structure of the control signal generator 73 of FIG. 9 and the outline of an example of the operation thereof. First, the comparing circuit 731 compares the inputted threshold 732 with a value obtained by processing the phase error data PED and outputs the result of the comparison to the switching determining circuit 733. The switching determining circuit 733 receives the result of the comparison from the comparing circuit 731 and the external signal S8 and outputs the control signal S7 for controlling the cross reference value generator 72 based on these signals.

A description will be given to the detail of a sequence of operation. The control signal generator 73 monitors the phase error data in the phase error calculator 71 and outputs the control signal S7 for switching to the zero cross detection method to the cross reference value generator 72 when the phase error becomes less than the threshold 732 with the specified value and approaching a steady state. When such a control signal S7 is outputted, the multi-input selecting circuit 72c of the cross reference value generator 72 that has received the control signal S7 selects the fixed value (i.e., the zero value) 72d in FIG. 4 and outputs the fixed value as the rising and falling cross reference values S5 and S6 to the cross detector 70.

Figure 10:
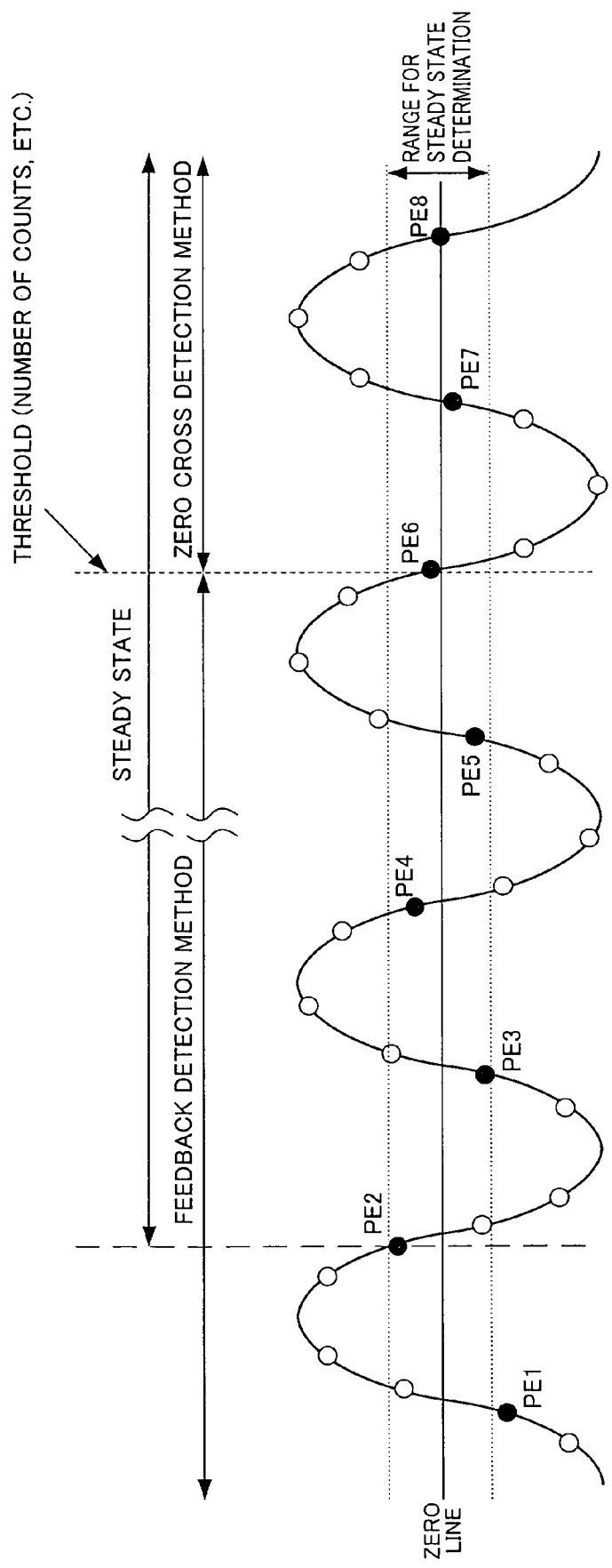
FIG. 10 is a view showing the outline of a phase error detection method for a phase error detecting circuit according to a fifth embodiment of the present invention.

A description will be given to the outline of such control with reference to FIG. 10. In the drawing, PE1 to PE8 are the phase error data points and the range defined by the upper and lower broken lines is a range for steady state determination in which the phase error is smaller than the threshold and determined to be in the steady state. In the drawing, the steady state starts at the phase error data point PE2. After the phase error is determined to be in the steady state, the number of the phase error data points is counted up and, at the time at which the number of counts exceeds the threshold 732, switching is performed from the feedback detection method based on the rising and falling cross reference values S5 and S6 to the zero cross detection method using the zero value as the reference value.

Specifically, during a period during which the phase error is not less than the threshold, the rising/falling cross reference values S5 and S6 are successively updated to be used as the reference data for the next cross detection. When the phase error becomes smaller and approaching the steady state, however, the cross reference value generator 72 outputs the zero value as the reference value and implements the conventional zero cross point detection method, thereby enabling efficient phase error detection.

Embodiment 6

A description will be given next to a phase error detecting circuit in the sixth embodiment. The present embodiment shows a variation of the switching from the feedback detection method, which is characteristic of the present invention, to the zero cross detection method.

In the present embodiment, the control signal generator 73 shown in FIG. 9 receives the phase error data PED, compares the value of phase error shown by the data with the threshold 732 with a predetermined value, and outputs the control signal S7 such that the updated cross reference value is selected when the value of the phase error shown by the data is exceeding the threshold value 732 and that the zero value is selected as the reference value when the value of the phase error shown by the data is not exceeding the threshold 732 but is in the vicinity of the zero cross.

Figure 11:
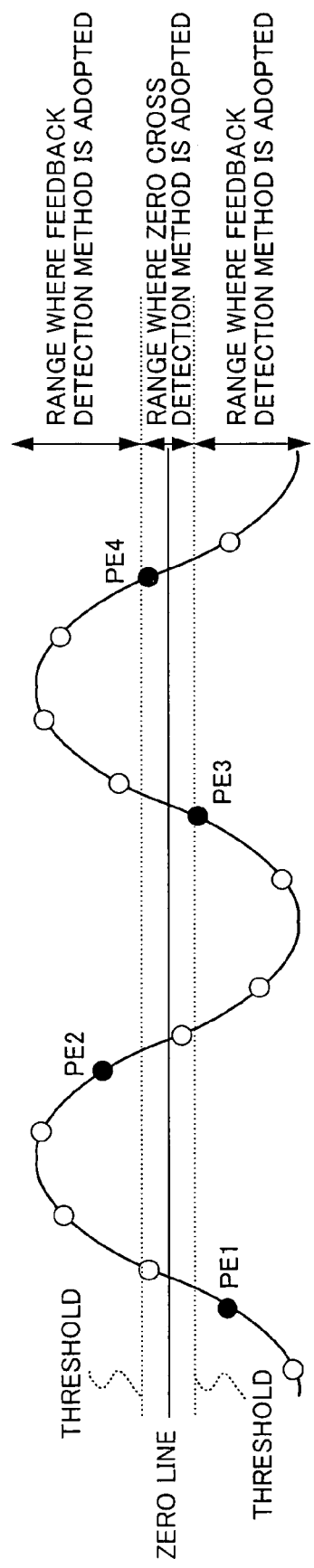
FIG. 11 is a view showing the outline of a phase error detection method for a phase error detecting circuit according to a sixth embodiment of the present invention.

A description will be given to the outline of the control with reference to FIG. 11. In the drawing, the circular marks are the sampling data points, PE1 to PE4 are the phase error data points, and the portion in the range defined by the upper and lower broken lines is a range where the zero cross detection method is adopted. The range where the zero cross detection method is adopted and a range where the feedback detection method is adopted are separated from each other by the threshold 732. Since the phase error is larger than the threshold 732 at each of the phase error data points PE1 and PE2, phase error detection is performed in accordance with the feedback detection method. At each of the phase error data points PE3 and PE4 where the phase error is less than the threshold 732, switching is performed to the zero cross detection method.

That is, when the phase error is exceeding the preliminarily specified threshold 732, the rising/falling cross reference values are updated to be used as the reference data for the next cross detection. When the phase error becomes smaller and less than the threshold 732, the cross reference value generator 72 outputs zero and implements the conventional zero cross point detection method, thereby enabling efficient phase error detection.

Embodiment 7

A description will be given next to a phase error detecting circuit in the seventh embodiment. The present embodiment will describe the case where switching between the cross detection methods is performed based on an external signal.

In an optical disk such as a DVD, sink marks (known codes) (specified pattern) are recorded with a given spacing. That is, the state in which the inter-sink spacing can be read indicates that the frequency error has become smaller. During detection which allows the spacing between the sink marks to be read, the switching determining circuit 733 of the control signal generator 73 receives a sink detection signal generated during the detection as the external signal S8 in FIG. 9. During the period during which the sink detection signal is LOW, such as immediately after a reproducing operation is started, a phase error is detected by using the feedback detection method. When the sink detection signal becomes HIGH through the reading of sinks, the control signal S7 is outputted to cause switching to the zero cross detection method.

By thus using the sink detection signal generated upon detection of the sinks that have been recorded with a given spacing as the external signal S8, the size of the frequency error is determined. When the sink detection signal is LOW, the feedback method is used so that the rising/falling cross reference values are updated and the updated cross reference values are used as the reference data for the next cross detection. In a situation with a small frequency error in which the sink detection signal has become HIGH, the conventional zero cross point detection method is adopted so that efficient phase error detection is enabled.

Embodiment 8

A description will be given next to a phase error detecting circuit according to the eighth embodiment. The present embodiment will describe another variation of the case where switching between the cross detection methods is performed based on the external signal.

There are cases where a reproduced signal from an optical disk such as a DVD is an abnormal state due to a flaw or contamination present thereon. An abnormal signal detection signal which is generated upon detection of the abnormal reproduced signal is inputted as the external signal S8 shown in FIG. 9 to the switching determining circuit 733 of the control signal generator 73. When the abnormal signal detection signal becomes HIGH, the control signal S7 is outputted as an operation reset signal to the cross reference value generator 72.

By thus monitoring the abnormal signal detection signal generated upon detection of the abnormal signal resulting from a flaw or contamination present on a recording medium, the cross reference values outputted from the cross reference value generator 72 are reset to specified values at the time at which the abnormal signal detection signal is detected. This makes it possible to suppress variations in phase error data resulting from the abnormal signal and realize efficient phase error detection.

It will easily be appreciated that, for the structure of the control signal generator 73, a structure which is a combination of the structure in each of the fifth and sixth embodiments and the structure in each of the seventh and eighth embodiments may also be adopted.

Embodiment 9

A description will be given next to a phase error detecting circuit according to the ninth embodiment of the present invention.

Figure 12:
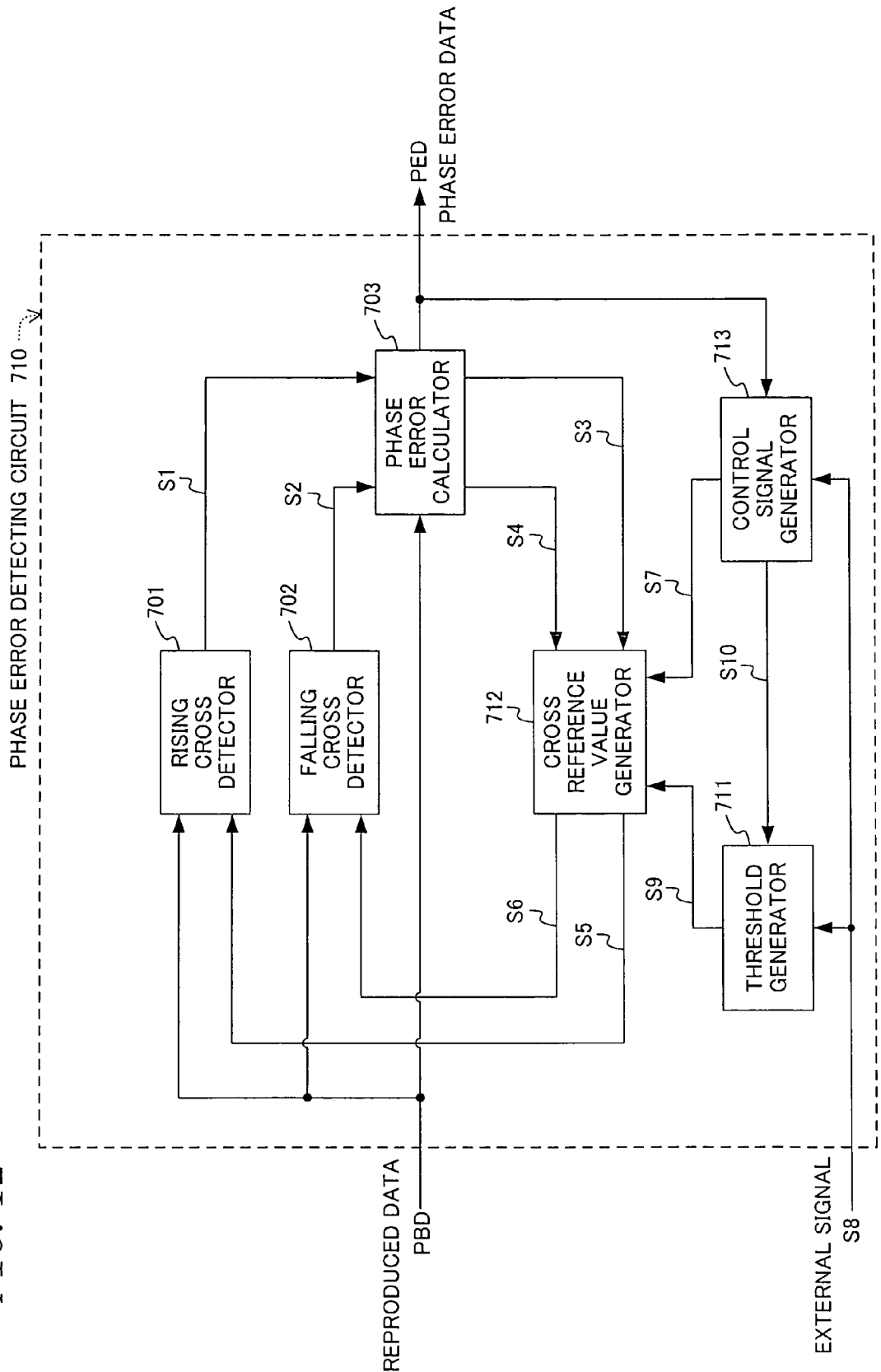
FIG. 12 is a view showing a phase error detecting circuit according to a ninth embodiment of the present invention.

FIG. 12 shows a structure of a phase error detecting circuit according to the present embodiment. In contrast to each of the embodiments described above in which the phase error data serving as the next zero cross point is detected by using the phase error data detected in the preceding process as the reference value, the present embodiment provides, when the phase error data detected in the previous process is used as the reference value, a threshold for the value of the phase error data to be used as the reference value, thereby suppressing a jitter or the like.

Specifically, in a phase error detecting circuit 710 shown in FIG. 12, a threshold generator 711 is further disposed, in contrast to the phase error detecting circuit shown in FIG. 1. With the disposition of the threshold generator 711, the structure of the cross reference value generator 712 has been modified.

Figure 13:
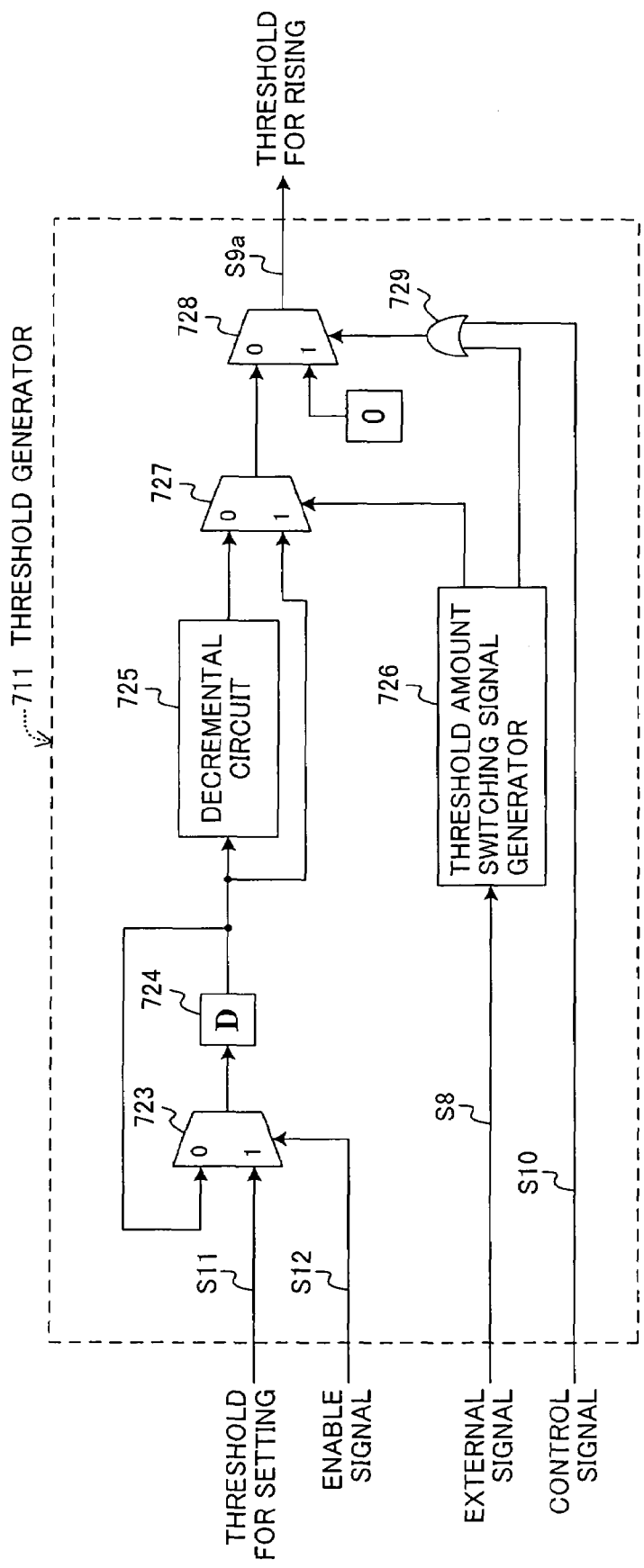
FIG. 13 is a view showing an internal structure of a threshold generator provided in the phase error detecting circuit.

A structure of the threshold generator 711 is shown in FIG. 13. The threshold generator 711 shown in the drawing shows the structure of only the portion thereof for generating a threshold for rising. Since the portion of the threshold generator 711 for generating a threshold for falling has the same structure; the depiction thereof is omitted. In the threshold generator 711 shown in the drawing, 723, 727, and 728 are selectors, 724 is a D flip-flop, 725 is a decremental circuit, 726 is a threshold amount switching signal generator (switching signal generator), and 729 is a logic circuit.

A threshold S11 for setting which is inputted from the outside is selected by the selector 723 and held in the D flip-flop 724. When the value of the threshold S11 for setting is changed to another, an enable signal S12 changes from the "0" value to "1" so that the threshold S11 for setting after the changing is selected by the selector 723 and held in the D flip-flop 724. The decremental circuit 725 mentioned above decreases the value of the threshold S11 held in the D flip-flop 724 under arbitrary settings. The threshold amount switching signal generator 726 receives the external signal S8. The external signal S8 is generated and outputted in a situation in which the number of occurrences of zero crossing of the reproduced data is less than the specified value during a specified period. The threshold amount switching signal generator 726 generates a switching signal upon receipt of the external signal S8 and outputs the switching signal to the selector (selecting circuit) 727. The selector 727 receives the switching signal, selects the threshold held in the D flip-flop 724 mentioned above, and selects the threshold from the decremental circuit 725 when it has not received the switching signal. The other selector 728 selects the threshold with a zero value when it has received the output signal from the threshold amount switching signal generator 726 or the control signal S10 from the outside via the logic circuit 729, while selecting the threshold with a specified value from the selector 727 when it has not received either of the output signal from the threshold amount switching signal generator 726 and the control signal from the outside, and outputs the selected threshold value as a threshold S9a for rising.

Figure 14:
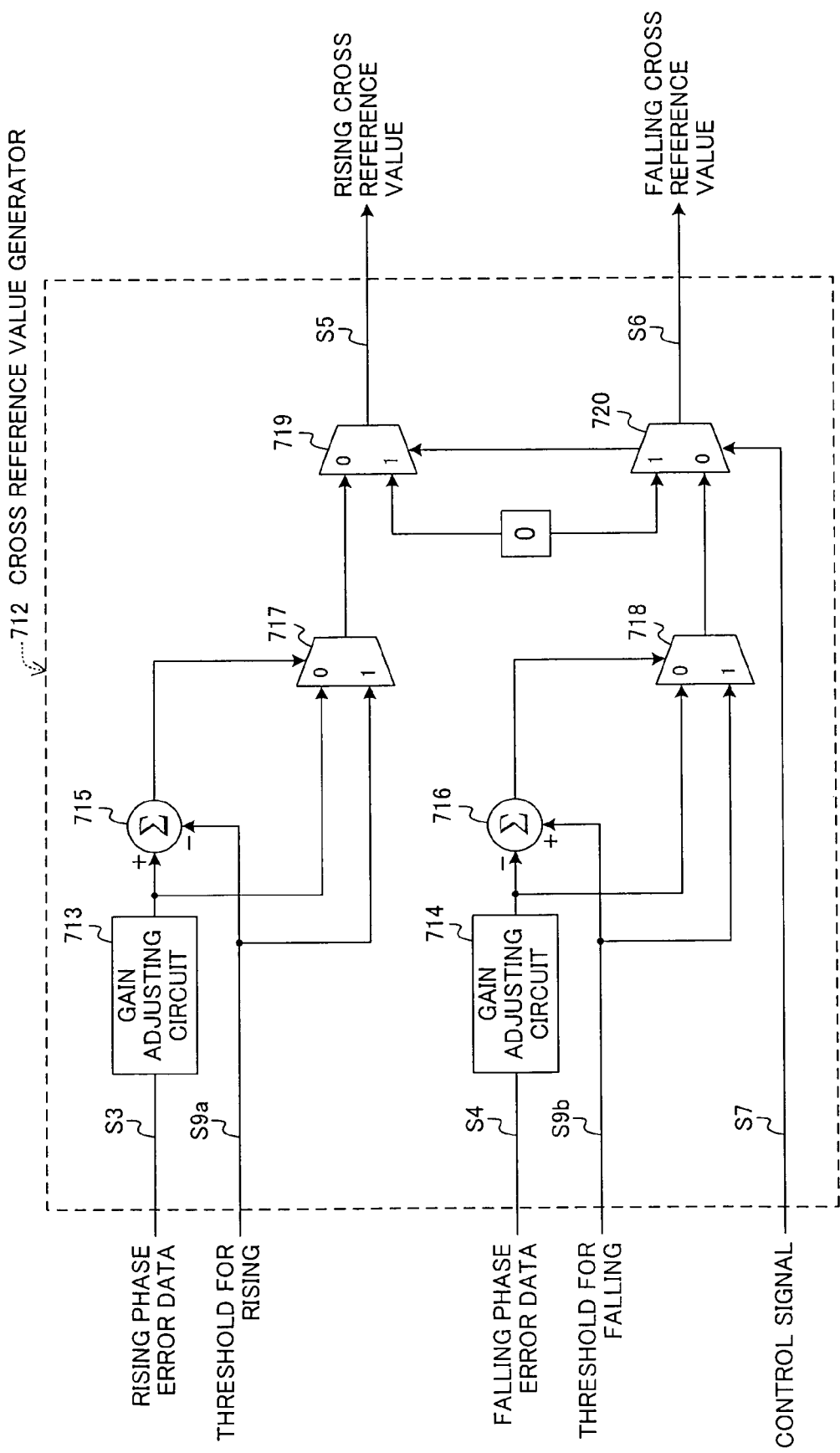
FIG. 14 is a view showing an internal structure of a cross reference value generator provided in the phase error detecting circuit.

A structure of the cross reference value generator 712 shown in FIG. 12 is shown in FIG. 14. In the drawing, 713 is a gain adjusting circuit for rising cross data, 714 is a gain adjusting circuit for falling cross data, 715 and 716 are subtractors, and 717, 718, 719, and 720 are selectors. The cross reference value generator 712 receives the rising and falling phase error data items S3 and S4 from the phase error calculator 703 described above, the threshold S9 from the threshold generator 711, and the control signal S7 from the control signal generator 713 and outputs the reference value S5 for rising and the reference value S6 for falling.

The subtractor 715 subtracts, from the rising phase error data S3 that has undergone the gain adjustment in the gain adjusting circuit 713, the threshold S9a for rising from the threshold generator 711 and outputs sign data resulting from the subtraction to the selector 717. The selector 717 selects the threshold S9a for rising when the sign data from the subtractor 715 mentioned above is positive ("1"), while selecting the rising phase error data when the sign data from the subtractor 715 is negative ("0"). In other words, the selector 717 compares the absolute value of the rising phase error data with that of the threshold S9a for rising, selects the smaller value, and outputs the selected value as the rising cross reference value. The other selector 719 receives the control signal S7 from the control signal generator 713, selects the rising cross reference value with the zero value when the value of the control signal is "1", while selecting the rising cross reference value from the selector 717 when the value of the control signal is "0", and outputs the selected cross reference value as the rising cross reference value S5 to the rising cross selector 701 of FIG. 12.

Since the generation of the rising cross reference value S5 in the cross reference value generator 712 that has been described thus far is the same as the generation of the falling cross reference value S6, the description thereof will be omitted.

A description will be given herein below to the operation of the phase error detecting circuit according to the present embodiment with reference to FIG. 15. The drawing shows a (3T+3T) repeating reproduced signal (T is a channel cycle period) and sampling points, wherein PE1, PE2, PE3, and PE4 are phase error data items, Lr1 is a rising cross reference value, Lf1 and Lf2 are falling cross reference values, Lrth is the threshold for rising, and Lfth is the threshold for falling.

Figure 15:
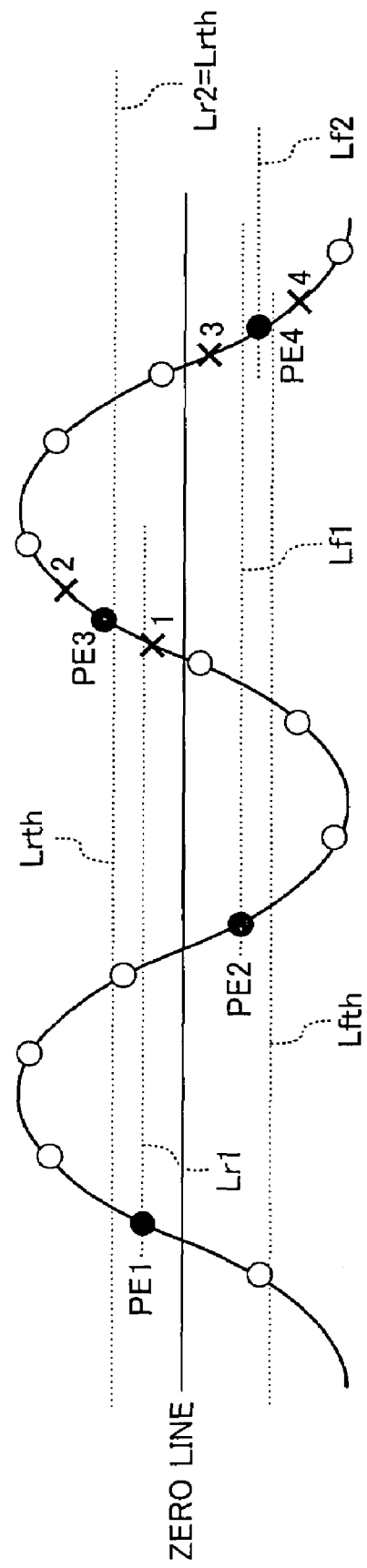
FIG. 15 is a view showing the outline of a cross data detection method for the phase error detecting circuit.

In FIG. 15, the selector 717 of the cross reference value generator 712 first selects the rising phase error data PE1 since the absolute value of the rising phase error data PE1 initially detected is smaller than that of the threshold Lrth for rising, so that the amplitude value of the rising phase error data PE1 becomes the rising cross reference value Lr1. The average value (shown by the mark "X 1" in the drawing) of the next phase error data PE3 and the phase error data previous thereto is less than the rising cross reference value Lr1 and negative, while the average value (shown by the mark "X 2" in the drawing) of the rising phase error data PE3 and the phase error data subsequent thereto is over the rising cross reference value Lr1 and positive, so that the phase error data PE3 is detected as the rising phase error data. Since the amplitude value of the rising phase error data PE3 is larger than the absolute value of the preset threshold Lrth for rising, the threshold Lrth for rising is used as the next rising cross reference value.

In the detection of the falling phase error data, the absolute value of the falling phase error data PE2 detected initially is smaller than that of the threshold Lfth for falling so that the amplitude value of the falling phase error data PE2 is used as the falling cross reference value Lf1. The absolute value of the average value (shown by the mark "X 3" in the drawing) of the next falling phase error data PE4 and the phase error data previous thereto is less than the absolute value of the falling cross reference value Lf1 mentioned above and negative, while the average value (shown by the mark "X 4" in the drawing) of the falling phase error data PE4 and the phase error data subsequent thereto is over the falling cross reference value Lf1 and positive so that the phase error data PE4 is detected as the falling phase error data. Since the falling phase error data PE4 is smaller than the absolute value of the preset threshold Lfth for falling, the amplitude value of the falling phase error data PE4 is used as the next falling cross reference value Lf2.

Since the present embodiment has thus provided the thresholds in using the phase error data detected one process before as the reference value for the detection of the next phase error data, the divergence of feedback control resulting from a jitter or disturbance can be suppressed and the capture range of the phase comparator can be enlarged.

Embodiment 10

A description will be given next to a phase error detecting circuit according to the tenth embodiment of the present invention.

The present embodiment has been obtained by partially modifying the structure of the cross reference value generator 712 according to the ninth embodiment.

Figure 16:
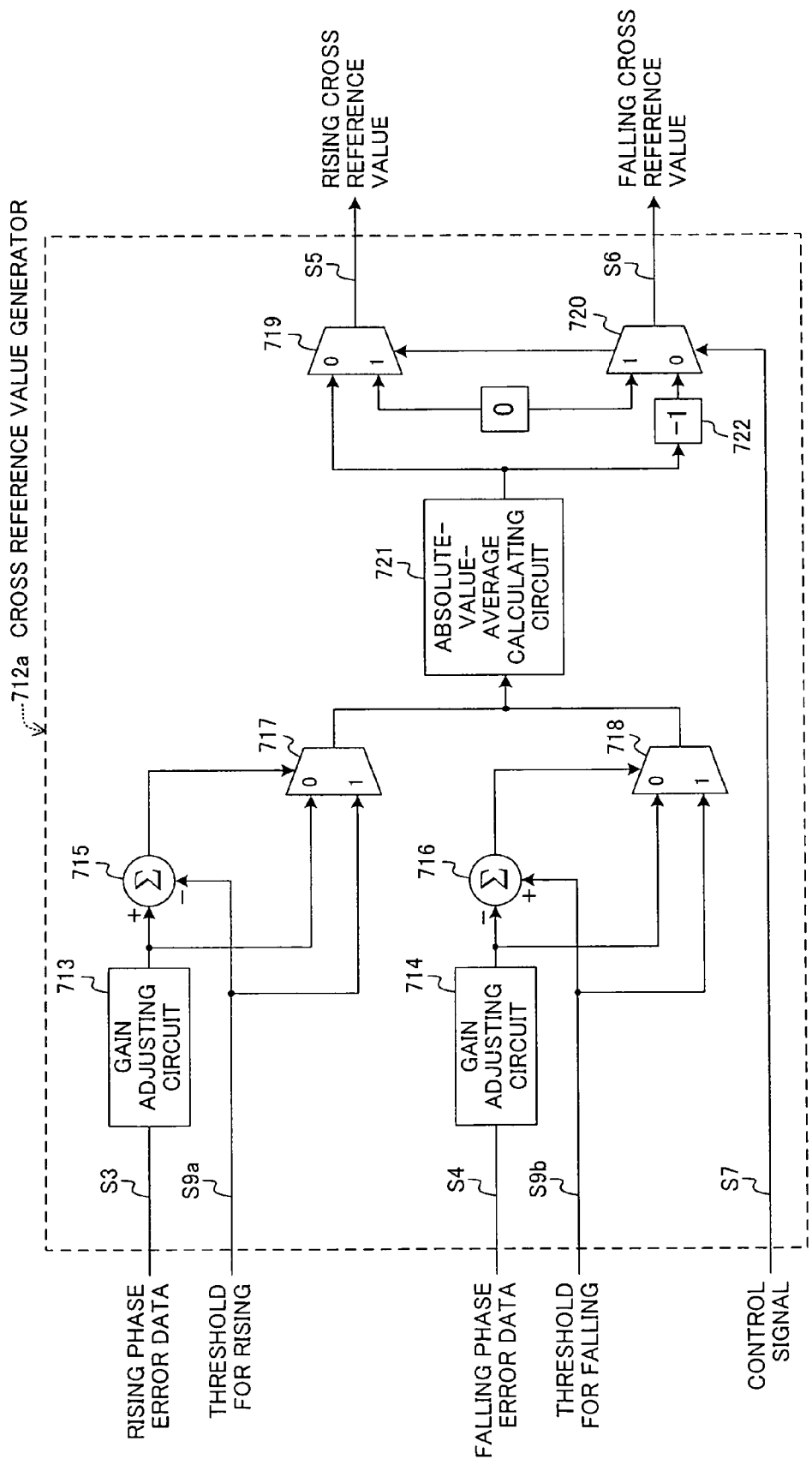
FIG. 16 is a view showing an internal structure of a cross reference value generator provided in a phase error detecting circuit according to a tenth embodiment of the present invention.

Specifically, an absolute-value-average calculating circuit 721 and a sign inverting circuit 722 have been added to a cross reference value generator 712a of FIG. 16. The absolute-value-average calculating circuit 721 calculates the average value of the absolute value of the rising cross reference value selected by the selector 717 and the absolute value of the rising cross reference value selected by the selector 718 and outputs the calculated average value. The average cross reference value from the absolute-value-average calculating circuit 721 is outputted as it is to the selector 719, subjected to sign inversion in the sign inverting circuit 722, and then outputted to the selector 720.

Thus, the cross reference value generator 712a shown in FIG. 16 adopts a common reference value with an equal absolute value for each of the cross reference values for the rising phase error data and the falling phase error data.

Figure 17:
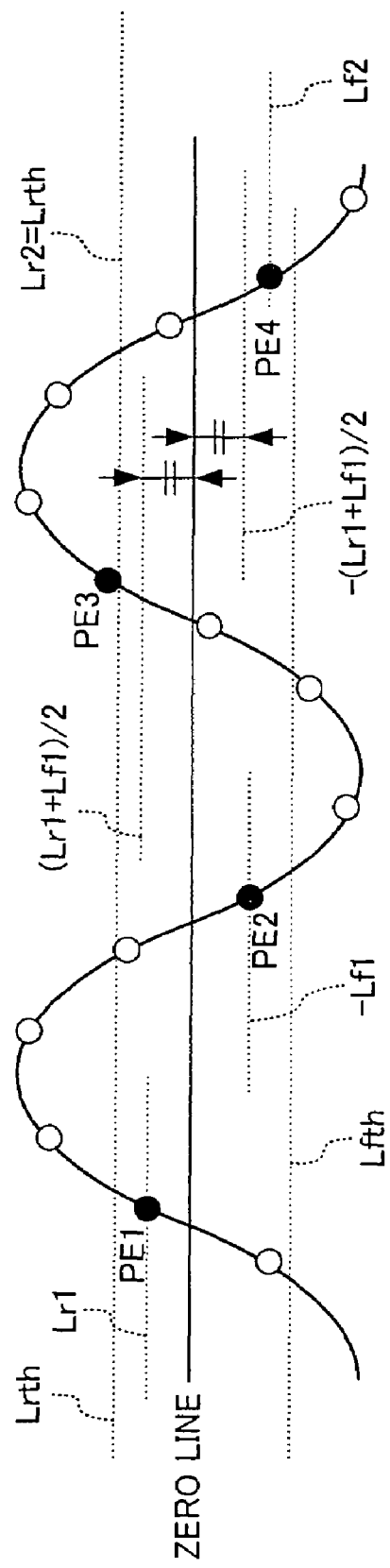
FIG. 17 is a view showing the outline of a cross data detection method for the phase error detecting circuit.

A description will be given to the operation of the phase error detecting circuit with reference to FIG. 17. The drawing shows a (3T+3T) repeating reproduced signal (T is a channel cycle period) and sampling points. In the drawing, the absolute value of the rising phase error data PE1 initially detected is smaller than that of the threshold Lrth for rising so that the amplitude value of the rising phase error data PE1 is used as the rising cross reference value Lr1. The absolute value of the falling phase error data PE2 initially detected is also smaller than that of the threshold Lfth for falling so that the amplitude value of the falling phase error data PE2 is used as the falling cross reference value Lf1. Thereafter, the average value ((Lr1+Kf1)/2) of the respective absolute values of the rising and falling cross reference values Lr1 and Lf1 is used as a reference value in detecting the next rising phase error data PE3, while a value—((Lr1+Kf1)/2) obtained by inverting the sign of the average value of the two absolute values is used as a reference value in detecting the next falling phase error data PE4.

Then, the following rising and falling cross reference values Lr2 and Lf2 are generated based on the result of comparing the respective absolute values of the amplitude values of the rising and falling phase error data items PE3 and PE4 with the respective absolute values of the two thresholds Lrth and Lfth for rising and falling.

Thus, the present embodiment can also suppress the divergence of the feedback control resulting from a jitter or disturbance and enlarge the capture range of the phase error detecting circuit, similarly to the ninth embodiment.

Embodiment 11

A description will be given next to a phase error detecting circuit according to the eleventh embodiment of the present invention. The present embodiment has been obtained by partially modifying the structure of the cross reference value generator 712 according to the ninth embodiment.

Figure 18:
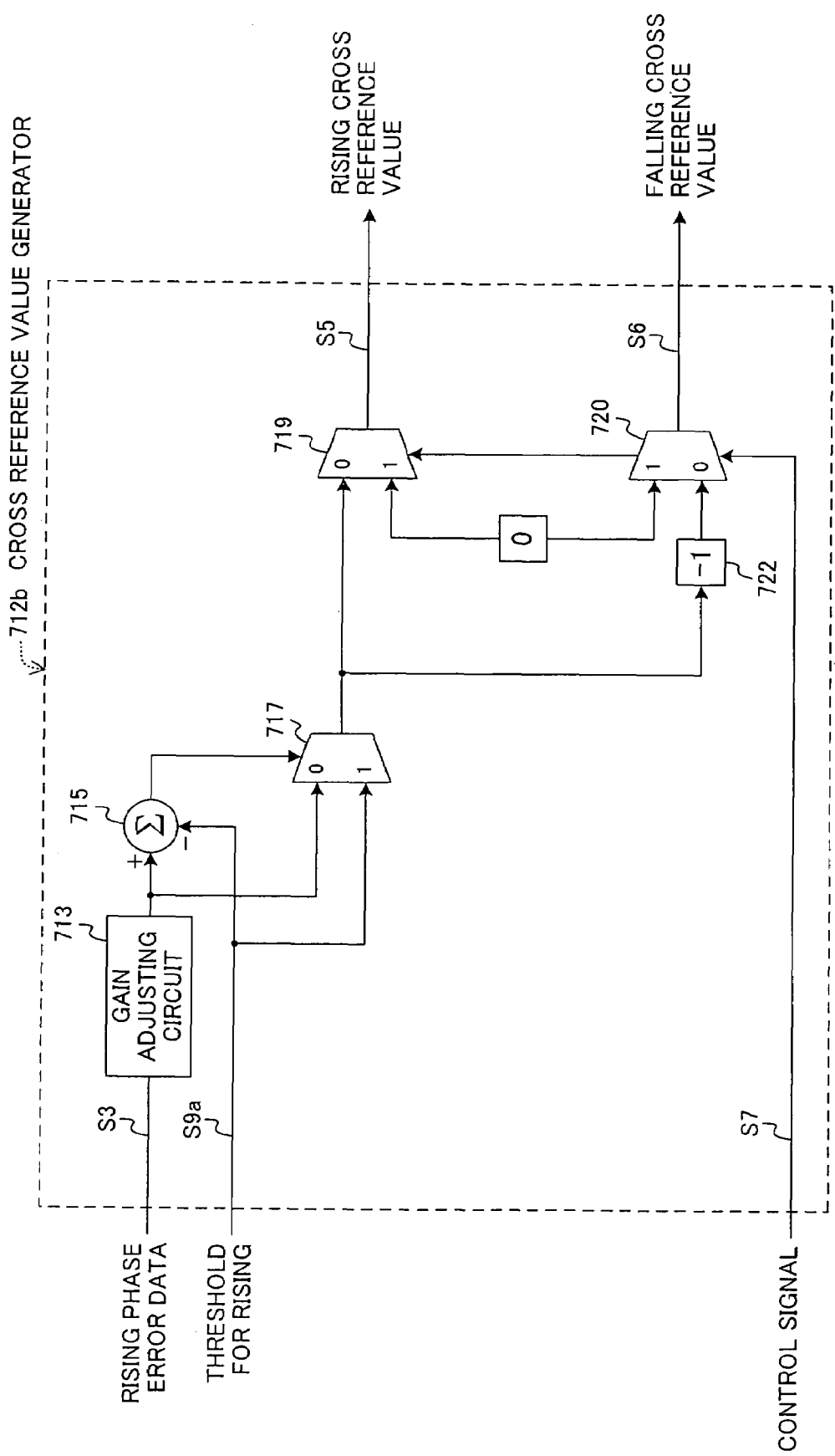
FIG. 18 is a view showing an internal structure of a cross reference value generator provided in a phase error detecting circuit according to an eleventh embodiment of the present invention.

Specifically, the cross reference value generator 712b according to the present embodiment shown in FIG. 18 has been constructed to input, as the falling cross reference value, a value obtained by inverting the sign of the rising cross reference value from the selector 717 for generating the rising reference value by using the sign inverting circuit 722 to the selector 720, while the gain adjustment circuit 714 for generating a falling reference value, the subtractor 716, and the selector 718 have been omitted from the cross reference value generator 712 shown in FIG. 14. As for the other components, they are the same as those of the cross reference value generator 712 shown in FIG. 12 so that the description thereof will be omitted.

Figure 19:
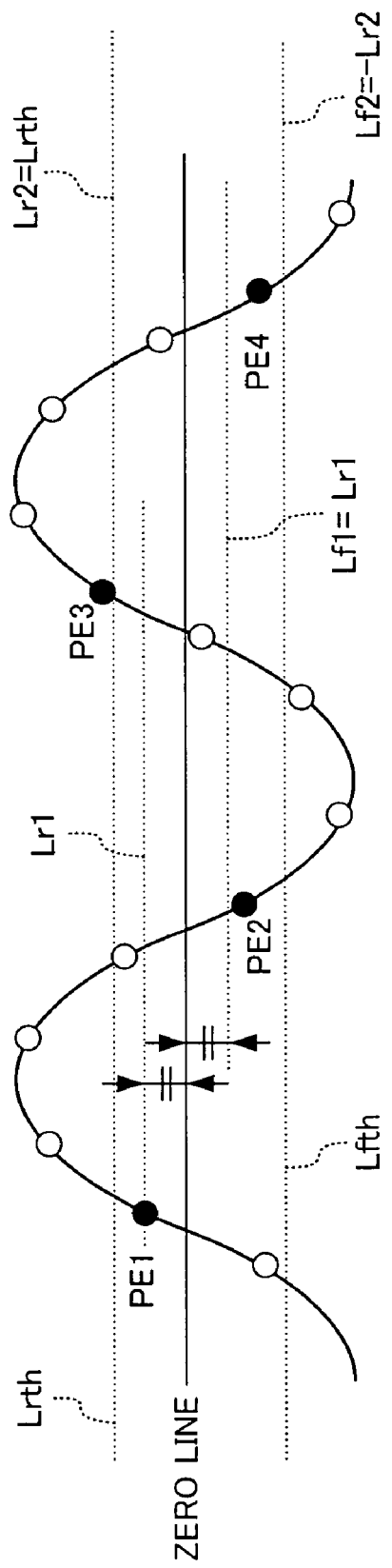
FIG. 19 is a view showing the outline of a cross data detection method for the phase error detecting circuit.

A description will be given next to the operation of the phase error detecting circuit according to the present embodiment with reference to FIG. 19. In FIG. 19, the absolute value of the rising phase error data PE1 initially detected is smaller than that of the threshold Lrth for rising so that the amplitude value of the rising phase error data PE1 is used as the rising cross reference value Lr1. On the other hand, a value obtained by inverting the sign of the rising cross reference value Lr1 is used as the falling cross reference value Lf1. Thereafter, the next rising phase error data PE3 is detected based on the rising cross reference value Lr1, while the next falling cross data PE4 is detected based on the falling cross reference value Lf1 (=Lr1).

Subsequently, the following rising and falling cross reference values Lr2 and Lf2 are generated based on the result of comparing the respective absolute values of the amplitude values of the rising and falling phase error data items PE3 and PE4 described above with the respective absolute values of the rising and falling thresholds Lrth and Lfth.

Figure 20:
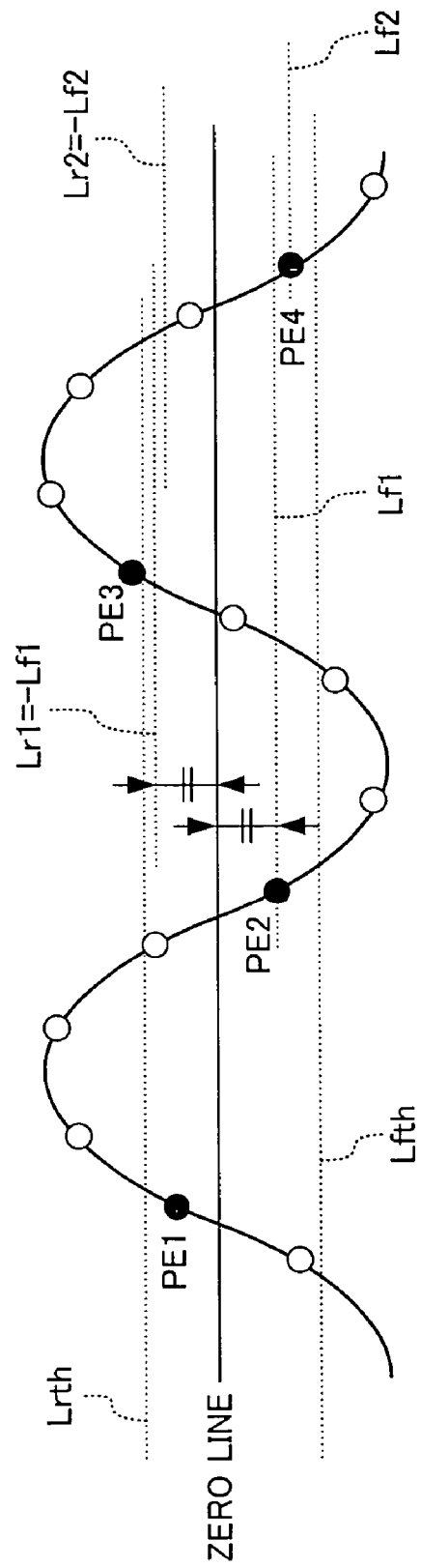
FIG. 20 is a view showing the outline of a cross data detection method when the phase error detecting circuit is modified.

Although the present embodiment has provided only the gain adjusting circuit 713 for generating a rising reference value, the subtractor 715, and the selector 717 as the cross reference value generator 712b, it will easily be appreciated that the cross reference value generator 712 of FIG. 12 may also be provided only with the gain adjusting circuit 714 for generating a falling reference value, the subtractor 716, and the selector 718. In this case, the falling cross reference value is generated and a value obtained by inverting the sign of the falling cross reference value is used as the rising cross reference value. The outline of the generation of the rising and falling cross reference values is shown in FIG. 20.

Embodiment 12

A description will be given next to a phase error detecting circuit according to the twelfth embodiment of the present invention.

The present embodiment specifies the time at which the control signal generator 713 shown in FIG. 12 generates the control signal.

Figure 21:
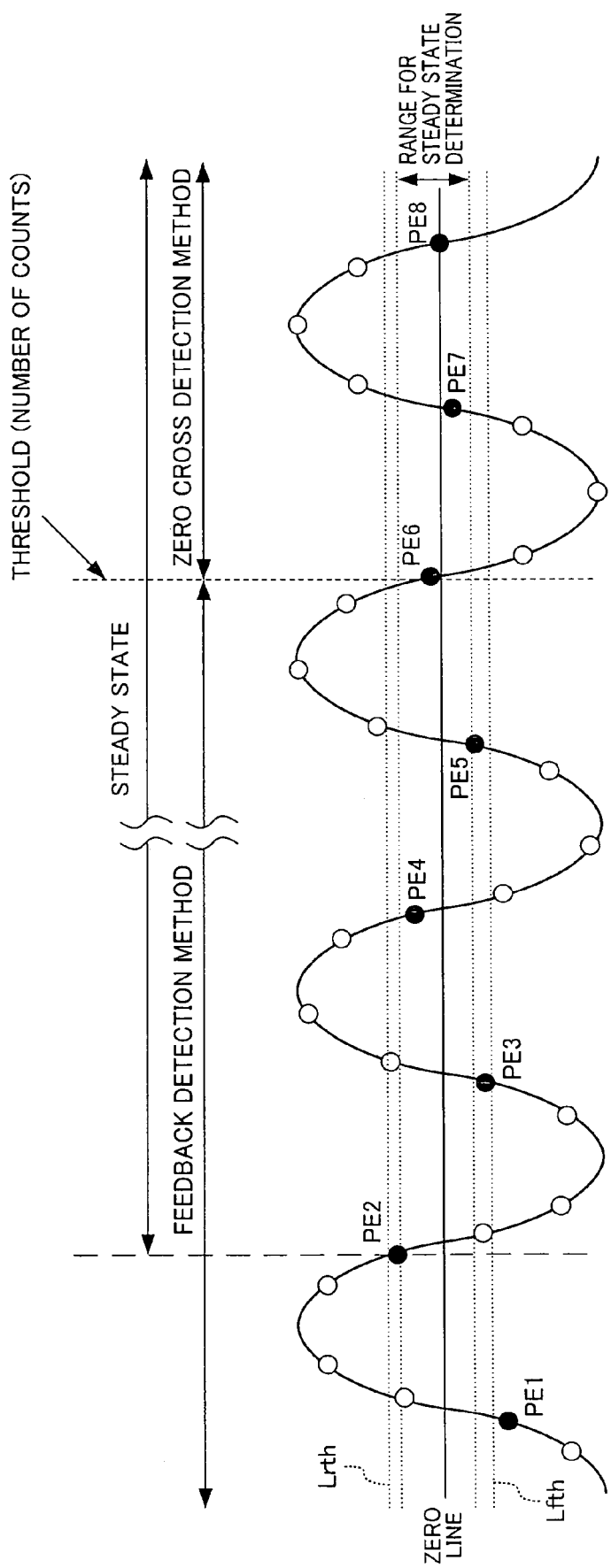
FIG. 21 is a view showing the outline of a cross data detection method for a phase error detecting circuit according to a twelfth embodiment of the present invention.

Specifically, the control signal generator 713 monitors the phase error data PED that has been inputted thereto from the phase error calculator 703, as shown in FIG. 12. When the phase error amount thereof decreases and comes into a range for steady state determination as shown in FIG. 21, the control signal generator 713 outputs the control signal S5 for switching to the zero cross detection method which fixes each of the rising and falling cross reference values to the zero level to the cross reference value generator 712 shown in FIG. 12 at the time at which the number of cross data points in the range for steady state determination reaches a specified threshold.

Accordingly, in the present embodiment, the reproduced data enters the range for steady state determination at the cross data point PE2. Thereafter, when the control signal generator 713 generates the control signal S7 at the time at which the total specified number (five) of cross data points PE2 to PE6 are counted, each of the two selectors 719 and 720 in the cross reference value generator 712 selects the cross reference value with the zero value, as shown in FIG. 14, so that switching is performed from the feedback detection method to the zero cross detection method.

Thus, the present embodiment updates the rising and falling cross reference values during a period during which the phase error amount is large and uses the updated rising and falling cross reference values as the reference values for the next cross data detection. When the phase error amount becomes smaller and approaching the steady state, however, it is possible to perform switching to the zero cross data detection method and implement efficient error phase detection.

Embodiment 13

A description will be given next to a phase error detecting circuit according to the thirteen embodiment of the present invention.

The present embodiment specifies a time other than the above as the time at which the control signal generator 713 shown in FIG. 12 generates the control signal.

Specifically, the control signal generator 713 monitors the phase error data PED that has been inputted thereto from the phase error calculator 703, as shown in FIG. 12, and compares the phase error amount thereof with a specified threshold. The thresholds are phase error amounts that have been preset to define a range where the zero cross detection method is used. As a result of comparing the inputted phase error data PED with the specified threshold, when the phase error data PED is less than the specified threshold and close to the zero cross, the control signal generator 713 generates the control signal with the "0" value and outputs the generated control signal to the cross reference value generator 712 shown in FIG. 12.

Figure 22:
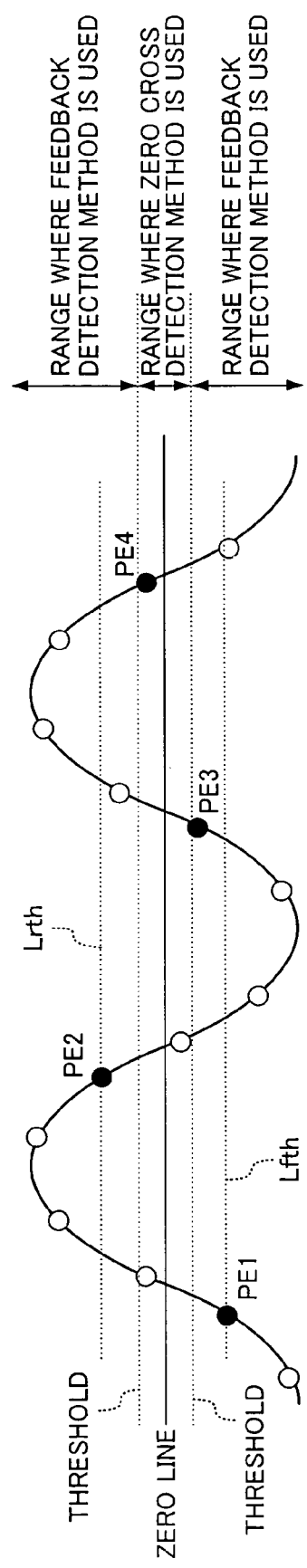
FIG. 22 is a view showing the outline of a cross data detection method for a phase error detecting circuit according to a thirteenth embodiment of the present invention.

As shown in FIG. 22, the present embodiment performs the cross data detection by the feedback detection method at each of the cross data points PE1 and PE2 where the phase error amount is large. However, when the phase error amount becomes less than the specified threshold as at each of the cross data points PE3 and PE4, the feedback detection method is switched to the zero cross detection method.

Accordingly, the present embodiment can also implement efficient phase error detection, similarly to the twelfth embodiment.

Embodiment 14

A description will be given next to a phase error detecting circuit according to the fourteenth embodiment of the present invention.

Similarly to the seventh embodiment described above, the present embodiment uses, as the external signal S8 inputted to the control signal generator 713, the sink detection signal generated upon detection of sink marks recorded with a specified spacing in an optical disk such as a DVD.

Upon receipt of the sink detection signal mentioned above, i.e., in a situation in which the frequency error of the reproduced data becomes small, the control signal generator 713 generates the control signal S7 with the "1" value and outputs the generated control signal S7 to the cross reference value generator 712. As shown in FIG. 14, each of the selectors 719 and 720 in the cross reference value generator 712 selects the cross reference value with the zero value so that the cross detection method is switched from the feedback method to the zero cross data detection method.

Accordingly, the present embodiment can also implement efficient phase error detection, similarly to the thirteenth embodiment.

Embodiment 15

A description will be given next to a phase error detecting circuit according to the fifteenth embodiment.

Similarly to the eighth embodiment described above, the present embodiment uses, as the external signal S8 inputted to the control signal generator 713, the abnormal signal detection signal generated upon detection of the abnormal reproduced signal which is the reproduced signal in an abnormal state resulting from a flaw, contamination, or the like on an optical disk.

Upon receipt of the abnormal signal detection signal, the control signal generator 713 generates the control signal S7 with the "1" value and resets the cross reference value to the zero value by using the cross reference value generator 712.

Accordingly, the present embodiment can suppress variations in cross data detected from the abnormal signal and implement efficient phase error detection.

It will easily be appreciated that, for the structure of the control signal generator 713, a structure which is a combination of the structure in each of the twelfth and thirteenth embodiments and the structure in each of the fourteenth and fifteenth embodiments may also be adopted.

INDUSTRIAL APPLICABILITY

As described above, even in a situation in which the reproduced data and the sampling clock are out of synchronization, the present invention allows precise detection of a phase error and the enlargement of the capture range so that it is useful as a phase error detecting circuit, a synchronous clock extracting circuit comprising the phase error detecting circuit, or the like.

What is claimed is:

1. A phase error detecting circuit for use in extracting, based on reproduced data that has been reproduced from a record reproducing apparatus and quantized, a synchronous clock which is synchronized with the reproduced data,
the reproduced data being data sampled and quantized by a not-yet-synchronized clock which is not yet adjusted to have a frequency of the synchronous clock,
the phase error detecting circuit comprising:
a cross detector for receiving the reproduced data sampled by the not-yet-synchronized clock and a specified reference value and detecting a cross timing at which the reproduced data sampled by the not-yet-synchronized clock the reference value;
a phase error calculator for receiving the reproduced data sampled by the not-yet-synchronized clock and a cross timing signal from the cross detector and calculating a difference between the value of the reproduced data sampled by the not-yet-synchronized clock and a zero value at the cross timing as phase error data including a phase error amount resulted from a frequency error between the synchronous clock and the not-yet-synchronized clock; and
a cross reference value generator for receiving the phase error data from the phase error calculator and updating the reference value of the cross detector based on the phase error data.

2. The phase error detecting circuit of claim 1, wherein the cross reference value generator updates, every time the phase error calculator calculates the phase error data, the calculated latest phase error data as the reference value for the cross detector.

3. The phase error detecting circuit of claim 1, wherein the cross detector has:
a rising cross detector for detecting a rising cross timing at which the reproduced data crosses the reference value upon rising thereof; and
a falling cross detector for detecting a falling cross timing at which the reproduced data crosses the reference value upon falling thereof.

4. The phase error detecting circuit of claim 3, wherein the phase error calculator calculates, upon receipt of a rising cross timing signal from the rising cross detector, a difference between the value of the reproduced data and the reference value at the rising cross timing as rising phase error data and calculates, upon receipt of a falling cross timing signal from the falling cross detector, a difference between the value of the reproduced data and the reference value at the falling cross timing as falling phase error data.

5. The phase error detecting circuit of claim 4, wherein the cross reference value generator receives the rising phase error data and the falling phase error data each from the phase error calculator and outputs the rising phase error data as a rising reference value to the rising cross detector, while outputting the falling phase error data as a falling reference value to the falling cross detector.

6. The phase error detecting circuit of claim 4, wherein the cross reference value generator receives the rising phase error data from the phase error calculator, outputs the rising phase error data as a rising reference value to the rising cross detector, and outputs rising phase error data obtained by inverting the sign of the rising phase error data as a falling reference value to the falling cross detector.

7. The phase error detecting circuit of claim 4, wherein the cross reference value generator receives the falling phase error data from the phase error calculator, outputs falling phase error data obtained by inverting the sign of the falling phase error data as a rising reference value to the rising cross detector, and outputs the falling phase error data as a falling reference value to the falling cross detector.

8. The phase error detecting circuit of claim 4, wherein the cross reference value generator receives the rising phase error data and the falling phase error data from the phase error calculator, calculates a ½ value of a sum of the inputted rising phase error data and falling phase error data, and outputs the ½ value of the sum and a value obtained by inverting the sign of the ½ value of the sum as a rising reference value and a falling reference value to the rising cross detector and to the falling cross detector.

9. The phase error detecting circuit of claim 1, wherein the cross reference value generator has a structure which fixes the reference value for the cross detector to zero, the phase error detecting circuit further comprising:
a control signal generator for outputting a control signal to the cross reference value generator such that switching is performed between updating of the reference value based on the phase error data and the fixing of the reference value to zero in the cross reference value generator.

10. The phase error detecting circuit of claim 9, wherein the control signal generator receives the phase error data from the phase error calculator and generates the control signal such that switching is performed between the updating of the reference value based on the phase error data and the fixing of the reference value to zero in the cross reference value generator depending on a phase error shown by the phase error data.

11. The phase error detecting circuit of claim 10, wherein the control signal generator outputs a control signal such that, when the phase error shown by the received phase error data becomes less than a specified value and approaching a steady state, the generation of the reference value is switched from the updating of the reference value based on the phase error data to the fixing of the reference value to zero.

12. The phase error detecting circuit of claim 10, wherein the control signal generator generates the control signal such that the reference value is updated based on the phase error data when the phase error shown by the received phase error data is not less than a specified threshold and that the reference value is fixed to zero when the phase error shown by the received phase error data is less than the specified threshold.

13. The phase error detecting circuit of claim 9, wherein the control signal generator receives a specified signal from an outside of the phase error detecting circuit and generates the control signal such that switching is performed between the updating of the reference value based on the phase error data and the fixing of the reference value to zero in the cross reference value generator in accordance with the specified signal from the outside.

14. The phase error detecting circuit of claim 13, wherein the control signal generator outputs the control signal such that the generation of the reference value is switched from the updating of the reference value based on the phase error data to the fixing of the reference value to zero upon receipt of a signal which is outputted when a specified pattern of the reproduced data is detected as the specified signal from the outside.

15. The phase error detecting circuit of claim 14, wherein the signal which is outputted when the specified pattern of the reproduced signal is detected is a sink detection signal which is generated upon detection of a spacing between sink marks in an optical disk.

16. The phase error detecting circuit of claim 9, wherein the control signal generator receives an abnormal detection signal which is generated when an abnormality occurs in the reproduced data and resets the reference value which is updated based on the phase error data in the cross reference value generator to a specified value.

17. The phase error detecting circuit of claim 9, wherein the control signal generator receives the phase error data from the phase error calculator and a specified signal from an outside of the phase error detecting circuit and generates the control signal such that switching is performed between the updating of the reference value based on the phase error data and the fixing of the reference value to zero in the cross reference value generator in accordance with the phase error shown by the phase error data and with the specified signal from the outside.

18. A synchronous clock extracting circuit comprising:
a phase error detecting circuit as recited in claim 1; and
a voltage control oscillator for receiving the phase error data outputted from the phase error detecting circuit and changing a frequency of a synchronous clock in accordance with a phase error shown by the phase error data.

19. The phase error detecting circuit of claim 1, further comprising:
a threshold generator for generating a threshold used to update the reference value for the cross detector, wherein
the cross reference value generator receives the threshold from the threshold generator and updates the reference value for the cross detector based on the threshold and on the phase error data from the phase error calculator.

20. The phase error detecting circuit of claim 19, wherein the threshold generator receives the phase error data from the phase error calculator and specified threshold data from an outside and uses the smaller one of an absolute value of the phase error data and an absolute value of the specified threshold data as the threshold.

21. The phase error detecting circuit of claim 20, wherein the threshold generator generates a threshold for rising cross timing and a threshold for falling cross timing.

22. The phase error detecting circuit of claim 21, wherein the cross detector has:
a rising cross detector for detecting a rising cross timing at which the reproduced data crosses the reference value upon rising thereof; and
a falling cross detector for detecting a falling cross timing at which the reproduced data crosses the reference value upon falling thereof.

23. The phase error detecting circuit of claim 22, wherein the phase error calculator receives a rising cross timing signal from the rising cross detector and calculates a difference between the value of the reproduced data and the reference value at the rising cross timing as rising phase error data and receives a falling cross timing signal from the falling cross detector and calculates a difference between the value of the reproduced data and the reference value at the falling cross timing as falling phase error data.

24. The phase error detecting circuit of claim 23, wherein the cross reference value generator receives the rising phase error data from the phase error calculator and the threshold for rising cross timing from the threshold generator and uses the smaller one of an absolute value of the rising phase error data and an absolute value of the threshold for rising cross timing as a rising reference value and receives the falling phase error data from the phase error calculator and the threshold for falling cross timing from the threshold generator and uses the smaller one of an absolute value of the falling phase error data and an absolute value of the threshold for falling cross timing as a falling reference value.

25. The phase error detecting circuit of claim 23, wherein the cross reference value generator receives the rising phase error data from the phase error calculator and the threshold for rising cross timing from the threshold generator and uses the smaller one of an absolute value of the rising phase error data and an absolute value of the threshold for rising cross timing as a rising reference value, while using a value obtained by inverting the sign of the rising reference value as a falling reference value.

26. The phase error detecting circuit of claim 23, wherein the cross reference value generator receives the falling phase error data from the phase error calculator and the threshold for falling cross timing from the threshold generator and uses the smaller one of an absolute value of the falling phase error data and an absolute value of the threshold for falling cross timing as a falling reference value, while using a value obtained by inverting the sign of the falling reference value as a rising reference value.

27. The phase error detecting circuit of claim 23, wherein the cross reference value generator has:
an absolute-value-average calculating circuit for calculating an average value of two absolute values which are the smaller one of an absolute value of the rising phase error data from the phase error calculator and an absolute value of the threshold for rising cross timing from the threshold generator and the smaller one of an absolute value of the falling phase error data from the phase error calculator and an absolute value of the threshold for falling cross timing from the threshold generator and uses the average value of the two absolute values calculated in the absolute-value-average calculating circuit as each of a rising reference value and a falling reference value.

28. The phase error detecting circuit of claim 19, wherein the cross reference value generator has, as the reference value for the cross detector, a zero reference value in addition to the reference value based on the threshold from the threshold generator and on the phase error data from the phase error calculator and has a selecting circuit for selecting either one of the zero reference value and the reference value based on the threshold and on the phase error data.

29. The phase error detecting circuit of claim 28, further comprising:
a control signal generator for generating a control signal such that the selecting circuit of the cross reference value generator is switched to the zero reference value.

30. The phase error detecting circuit of claim 29, wherein the control signal generator receives the phase error data calculated in the phase error calculator, generates the control signal when the phase error data has converged to be less than a specified value, and outputs the control signal to the selecting circuit of the cross reference value generator.

31. The phase error detecting circuit of claim 29, wherein, when the record reproducing apparatus is reproducing data from an optical disk, the control signal generator generates the control signal upon detection of a spacing between sink marks recorded in the optical disk and outputs the control signal to the selecting circuit of the cross reference value generator.

32. The phase error detecting circuit of claim 19, wherein the threshold generator comprises:
   a decremental circuit for gradually decreasing a specified threshold;
   a selecting circuit for selecting either one of the specified threshold and a threshold resulting from the decreasing of the specified threshold by the decremental circuit; and
   a switching signal generator for generating a switching signal for switching the selecting circuit to a position of the decremental circuit.

33. The phase error detecting circuit of claim 32, wherein the switching signal generator generates the switching signal when the number of occurrences of zero crossing of the reproduced data is less than a specified value during a specified period and outputs the generated witching signal to the selecting circuit.

34. The phase error detecting circuit of claim 32, wherein the threshold generator has a selecting circuit for receiving a control signal from an outside and selecting a threshold with a zero value.

35. The phase error detecting circuit of claim 19, wherein the cross reference value generator has a gain adjusting circuit for adjusting a value of the phase error data from the phase error calculator to a specified multiple of the original value.

36. A synchronous clock extracting circuit comprising:
   a phase error detecting circuit as recited in claim 19 and
   a voltage control oscillator for receiving the phase error data outputted from the phase error detecting circuit and changing a frequency of a synchronous clock in accordance with a phase error shown by the phase error data.

* * * * *

UNITED STATES PATENT AND TRADEMARK OFFICE
CERTIFICATE OF CORRECTION

PATENT NO.         : 7,423,948 B2
APPLICATION NO. : 10/533434
DATED              : September 9, 2008
INVENTOR(S)       : Akira Kawabe et al.

It is certified that error appears in the above-identified patent and that said Letters Patent is hereby corrected as shown below:

On the title page:

In Item "(75) Inventors", change the city of residence for inventor

Akira Kawabe from "Takatsuki" to --Osaka--; and change the city of residence for inventor Kouji Okamoto from "Ikeda" to --Osaka--.

Signed and Sealed this

Seventeenth Day of March, 2009

JOHN DOLL
*Acting Director of the United States Patent and Trademark Office*